US009379838B2

(12) United States Patent
Nagarajan et al.

(10) Patent No.: US 9,379,838 B2
(45) Date of Patent: Jun. 28, 2016

(54) OPTICAL COMMUNICATION SYSTEM HAVING TUNABLE SOURCES

(75) Inventors: Radhakrishnan L. Nagarajan, Cupertino, CA (US); Masaki Kato, Palo Alto, CA (US); Michael Francis Van Leeuwen, Bethesda, MD (US); Timothy Butrie, Hellertown, PA (US)

(73) Assignee: Infinera Corporation, Sunnyvale, CA (US)

( * ) Notice: Subject to any disclaimer, the term of this patent is extended or adjusted under 35 U.S.C. 154(b) by 131 days.

(21) Appl. No.: 13/341,111

(22) Filed: Dec. 30, 2011

(65) Prior Publication Data

US 2013/0170833 A1    Jul. 4, 2013

(51) Int. Cl.
*H04J 14/02* (2006.01)
*H04J 14/00* (2006.01)

(52) U.S. Cl.
CPC ..................... *H04J 14/02* (2013.01)

(58) Field of Classification Search
CPC ...................................................... H04J 14/02
See application file for complete search history.

(56) References Cited

U.S. PATENT DOCUMENTS

| | | | | |
|---|---|---|---|---|
| 6,369,923 B1* | 4/2002 | Kuo | ................... | H04B 10/504 398/91 |
| 7,155,078 B2* | 12/2006 | Welch | ................... | B82Y 20/00 385/14 |
| 8,155,531 B2* | 4/2012 | Murthy | ................... | H04B 10/506 398/158 |
| 8,582,975 B2* | 11/2013 | Nagarajan | ................... | H04J 14/0246 398/137 |
| 2004/0264963 A1* | 12/2004 | Kani | ................... | H04J 14/0226 398/72 |
| 2005/0141892 A1* | 6/2005 | Park | ................... | H04B 10/032 398/71 |
| 2005/0220397 A1* | 10/2005 | Oikawa | ................... | H04J 14/02 385/24 |
| 2007/0264020 A1* | 11/2007 | Li | ................... | H04J 14/02 398/135 |
| 2008/0080866 A1* | 4/2008 | Bai | ................... | H04J 14/02 398/87 |
| 2009/0202196 A1* | 8/2009 | Kish, Jr. | ................... | B82Y 20/00 385/14 |
| 2009/0220191 A1* | 9/2009 | Evans | ................... | G02B 6/12019 385/14 |
| 2009/0238579 A1* | 9/2009 | Rahn | ................... | H04B 10/697 398/152 |
| 2010/0290790 A1* | 11/2010 | Murthy | ................... | H04B 10/66 398/192 |
| 2011/0293279 A1* | 12/2011 | Lam | ................... | H04J 14/0279 398/79 |
| 2013/0011134 A1* | 1/2013 | Hsiao | ................... | H04J 14/02 398/43 |
| 2013/0170787 A1* | 7/2013 | Nagarajan | ................... | H04B 10/506 385/14 |
| 2013/0170833 A1* | 7/2013 | Nagarajan | ................... | H04J 14/02 398/48 |
| 2013/0195456 A1* | 8/2013 | Sorin | ................... | H04B 10/504 398/65 |
| 2013/0223844 A1* | 8/2013 | Hwang | ................... | H04B 10/572 398/91 |
| 2015/0071312 A1* | 3/2015 | Batshon | ................... | H04B 10/2575 370/542 |
| 2015/0372763 A1* | 12/2015 | Wang | ................... | H04B 10/58 398/81 |

* cited by examiner

*Primary Examiner* — Ken N Vanderpuye
*Assistant Examiner* — Amritbir Sandhu
(74) *Attorney, Agent, or Firm* — Harrity & Harrity LLP; David L. Soltz

(57) ABSTRACT

Pairs of distributed feedback (DFB) lasers are provided on a substrate. An arrayed waveguide grating (AWG) is also provided on the substrate having input waveguides, each of which being connected to a corresponding pair of DFB lasers. The wavelengths of optical signals supplied from each pair of DFB lasers may be spectrally spaced from one another by a free spectral range (FSR) of the AWG. By selecting either a first or second DFB laser in a pair and temperature tuning to adjust the wavelength, each pair of DFB lasers can supply optical signals at one of four wavelengths, pairs of which are spectrally spaced from one another by the FSR of the AWG. A widely tunable transmitter may thus be obtained.

26 Claims, 15 Drawing Sheets

OPTICAL COMMUNICATION SYSTEM HAVING TUNABLE SOURCES

BACKGROUND

Wavelength division multiplexed (WDM) optical communication systems are known in which multiple modulated optical signals, each having a different wavelength, are transmitted on a common optical communication path. The wavelengths of such optical signals are often in a so-called "C-band", i.e., within a range of 1530 nm to 1565 nm. The C-band corresponds to a low loss window or range of silica based optical fibers. The optical signal wavelengths often conform to a grid, in which each wavelength is spectrally spaced from one another by a uniform spectral spacing, such as 25 GHz.

WDM optical communication systems often include optical transmitters, which output the optical signals, and an optical combiner, which combines the optical signals into a WDM optical signal that is supplied to one end of an optical communication path. At a receive end, the optical signals may be demultiplexed and supplied to corresponding optical receivers.

In many WDM optical communication systems, the optical transmitters, as well as the optical combiner are provided as discrete components.

Photonic integrated circuits (PICs), however, are known in which the transmitters and the optical combiner are provided or integrated on a common substrate. The light from each transmitter, which may include a semiconductor laser (e.g., a distributed feedback or DFB laser), may be separately modulated to carry a corresponding data stream and combined by the optical combiner to provide the wavelength division multiplexed (WDM) optical signal. PIC-based optical communication systems may have improved reliability and reduced cost compared to systems including discrete transmitter and combiner components.

PICs have been deployed whereby the wavelengths of the light supplied from each laser is substantially fixed. Accordingly, specific PICs may be designed and manufactured to provide optical signals having specific wavelengths, such that, one PIC is fabricated to supply optical signals having first wavelengths for use in a particular network implementation, while a second PIC may be fabricated to supply optical signals having second wavelengths for use in a different network implementation.

In order to reduce manufacturing costs, a common PIC having tunable lasers that may be configured to output light having different wavelengths over a relative wide spectral range or band is desired. Typically, wavelength tuning may be achieved by changing the temperature of the tunable laser. In order to tune the laser over a wide range, the temperature of the laser must also be adjusted over a wide range. If the tuning temperature extends from room temperature at the low end of the range, the tuning temperature at the high end can be excessive and could exceed the junction temperature at which the lasers reliably operate. Moreover, at higher temperatures, the laser output power may drop, particularly if the laser is a DFB laser.

Accordingly, there is a need to provide a PIC having tunable lasers that can supply optical signals having wavelengths that may be tuned over a wide spectral range but with manageable changes in temperature.

SUMMARY

According to one aspect, an apparatus may comprise a first optical source configured to supply a first optical signal having a first wavelength; a second optical source configured to supply a second optical signal having a second wavelength; an arrayed waveguide grating having input waveguides, a first dielectric slab, a second dielectric slab, intermediate waveguides extending between the first and second dielectric slabs, and an output waveguide, one of the input waveguides having associated first and second passbands, the first passband being spectrally spaced from the second passband, the first passband including the first wavelength and the second passband including the second wavelength. A control circuit may be configured to selectively control the first and second optical sources to supply one of the first and second optical signals to one of the input waveguides, wherein, when the first optical signal is supplied to one of the input waveguides, the first optical signal is output from the output waveguide, and when the second optical signal is supplied to one of the plurality of input waveguides, the second optical signal is output from the output waveguide.

According to another aspect, an apparatus may include a first optical source configured to supply a first optical signal having a first wavelength at a first temperature and a second optical signal having a second wavelength at a second temperature. The apparatus may further include a second optical source configured to supply a third optical signal having a third wavelength at the first temperature and a fourth optical signal having a fourth wavelength at the second temperature; an arrayed waveguide grating may have input waveguides, a first dielectric slab, a second dielectric slab, intermediate waveguides extending between the first and second dielectric slabs, and an output waveguide, one of the input waveguides having associated first and second passbands at the first temperature, the first passband being spectrally spaced from the second passband, the first passband including the first wavelength and the second passband including the second wavelength, and one of the input waveguides having associated third and fourth passbands at the second temperatures, the third passband including the third wavelength and the fourth passband including the fourth wavelength. A control circuit may be configured to selectively control the first and second optical sources to supply one of the first or second optical signals to one of the quantity of input waveguides at the first temperature and one of the third and fourth optical signals at the second temperature, wherein, when the first optical signal is supplied to said one of the input waveguides, the first optical signal is output from the output waveguide, when the second optical signal is supplied to one of the plurality of input waveguides, the second optical signal is output from the output waveguide, when the third optical signal is supplied to one of the input waveguides, the third optical signal is output from the output waveguides, and, when the fourth optical signal is supplied to one of the input waveguides, the fourth optical signal is output from the output waveguide.

According to another aspect, an apparatus may include a substrate; a first set of optical sources provided on the substrate, each of which being configured to supply a corresponding one of a first quantity of optical signals at a first temperature, each of the first optical signals having a corresponding one of a first quantity of wavelengths; a second set of optical sources provided on the substrate, each of which being configured to supply a corresponding one of a second quantity of optical signals at the first temperature, each of the second quantity of optical signals having a corresponding one of a second quantity of wavelengths, such that, at a second temperature, each of the first quantity of optical sources supplies a corresponding one of a third quantity of optical signals, each of which having a corresponding one of a third quantity of wavelengths, and, at the second temperature, each of the second quantity of optical sources supplies a corresponding one of a fourth quantity of optical signals, each of which having a corresponding one of a fourth quantity of wavelengths. The apparatus may further include an arrayed waveguide grating provided on the substrate, the arrayed waveguide grating having a quantity of input waveguides, a first dielectric slab, a second dielectric slab, a quantity of intermediate waveguides extending between the first and second dielectric slabs, and an output waveguide, such that: at a first temperature, each of the quantity of input waveguides being associated with a corresponding one of a first quantity of passbands and a corresponding one of a second quantity of passbands, each of the first quantity of passbands including a corresponding one of the first quantity of wavelengths and each of the second quantity of passbands including a corresponding one of the second quantity of wavelengths, and at a second temperature, each of the quantity of input waveguides being associated with a corresponding one of a third quantity of passbands and a corresponding one of a fourth quantity of passbands, each of the third quantity of passbands including a corresponding one of the third quantity of wavelengths and each of the fourth quantity of passbands including a corresponding one of the fourth quantity of wavelengths, a control circuit configured to selectively control the first quantity of optical sources and the second quantity of optical sources to supply at least one of either the first quantity of optical signals or the second quantity of optical signals, wherein, said at least one of either the first quantity of optical signals or the second quantity of optical signals is supplied to the output waveguide of the arrayed waveguide grating.

In another aspect, an apparatus may include a first optical source configured to supply a first optical signal having a first wavelength; a second optical source configured to supply a second optical signal having a second wavelength; a third optical source configured to supply a third optical signal having a third wavelength; a fourth optical source configured to supply a fourth optical signal having a fourth wavelength; an arrayed waveguide grating having a quantity of input waveguides, a first dielectric slab, a second dielectric slab, a quantity of intermediate waveguides extending between the first and second dielectric slabs, and an output waveguide, one of the quantity of input waveguides having associated first, second, third, and fourth passbands, the first passband including the first wavelength, the second passband including the second wavelength, the third passband including the third wavelength, and the fourth passband including the fourth wavelength; a control circuit configured to selectively control the first, second, third and fourth optical sources to supply one of the first, second, third, and fourth optical signals to said one of the quantity of input waveguides, wherein, when the first optical signal is supplied to said one of the quantity of input waveguides, the first optical signal is output from the output waveguide, when the second optical signal is supplied to said one of the quantity of input waveguides, the second optical signal is output from the output waveguide, when the third optical signal is supplied to one of the quantity of input waveguides, the third optical signal is output from the output waveguide, and, when the fourth optical signal is supplied to said one of the quantity of input waveguides, the fourth optical signal is output from the output waveguide.

In yet another aspect, an optical receiver, may include a quantity of local oscillator lasers, each of which being configured to supply a corresponding one of a quantity of local oscillator signals; an optical hybrid circuit configured to receive an incoming optical signal, the optical hybrid circuit having a quantity of outputs; a control circuit configured to selectively activate one of the quantity of local oscillator lasers, such that said one of the quantity of local oscillator lasers supplies one of the quantity of local oscillator signals to the optical hybrid circuit; and a plurality of photodiodes, each of which being configured to receive light provided by a corresponding one of the quantity of outputs.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

Figure 1:
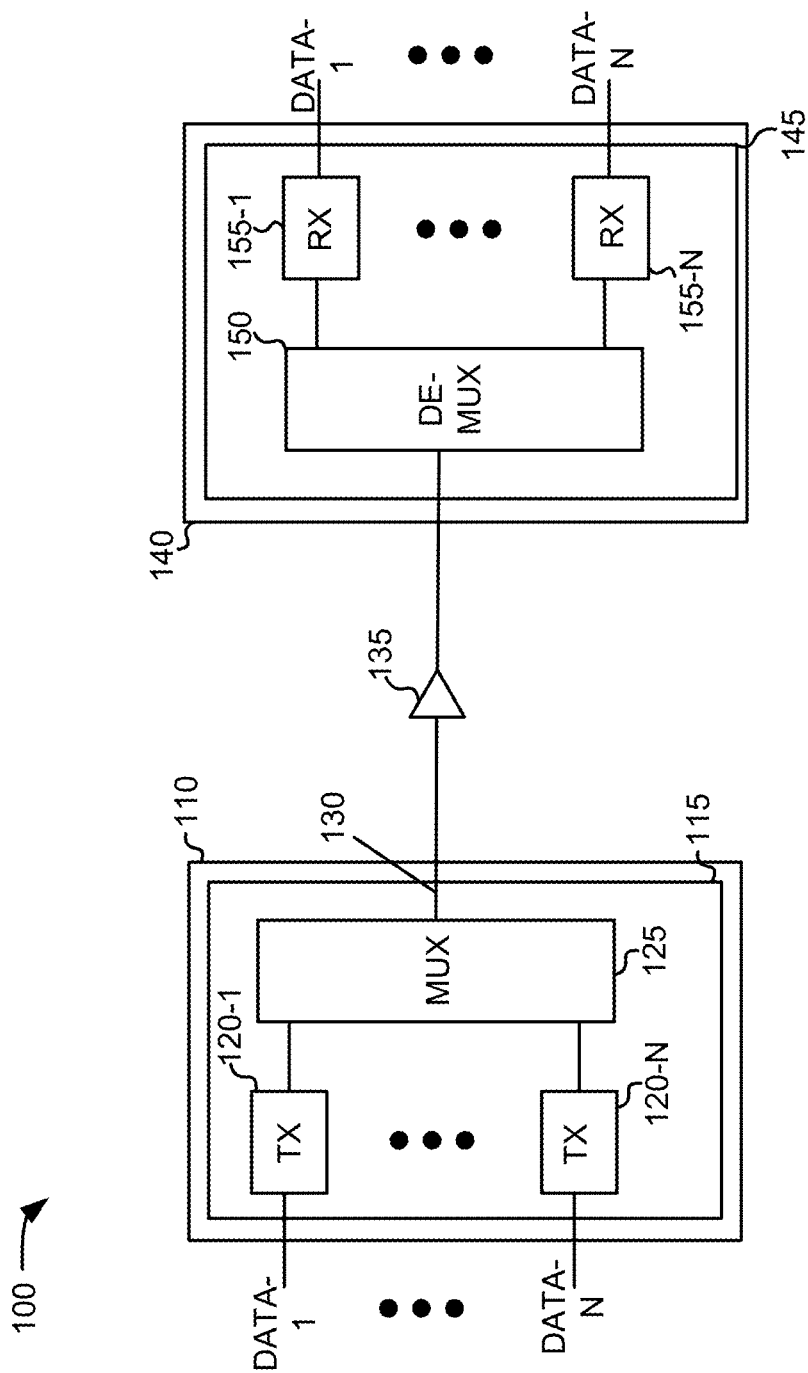
FIG. 1 is a diagram that conceptually illustrates components of an example optical communication system.

The following detailed description refers to the accompanying drawings. The same reference numbers in different drawings may identify the same or similar elements.

Consistent with one example of the present disclosure, pairs of distributed feedback (DFB) lasers are provided on a substrate. Each DFB laser in each pair supplies a corresponding optical signal, such that each optical signal has a different wavelength. An arrayed waveguide grating (AWG) is also provided on the substrate having input waveguides, each of which being connected to a corresponding pair of DFB lasers. The wavelengths of optical signals supplied from each pair of DFB lasers may be spectrally spaced from one another by a free spectral range (FSR) of the AWG. Accordingly, the optical signals output from either DFB laser in the pair may be input to the AWG and combined with other optical signals onto an output waveguide of the AWG. As a result, in operation, the wavelength of an optical signal supplied from one DFB in a given pair may be at a first wavelength or it may be temperature tuned to a second wavelength that is spectrally spaced from the first wavelength. Similarly, another optical signal supplied from the other DFB in the pair may be at third wavelength that is an FSR from the first wavelength or it may be temperature tuned to a fourth wavelength that is spectrally spaced from the second wavelength by the FSR. Thus, by selecting either a first or second DFB laser in a pair and temperature tuning to adjust the optical signal wavelength, each pair of DFB lasers can supply optical signals at one of four wavelengths, pairs of which (e.g., the first and third, and second and fourth wavelengths noted above) are spectrally spaced from one another by the FSR of the AWG. Remaining pairs of DFBs on the PIC substrate can similarly provide optical signals having wavelengths between the first, second, third, and fourth wavelengths. In a further example, the AWG FSR may be 250 GHz and ten pairs of DFB lasers may be provided on a PIC substrate, resulting in a PIC that can selectively output ten arbitrary wavelengths (but preferably conforming to a 25 GHz grid) in a range of 1 THz (1000 GHz). It is noted, however, that if tuning is performed by adjusting the temperature of the substrate upon which the lasers and AWG are provided, only certain wavelengths may be selected.

Thus, there is no need to temperature tune each laser over an excessively wide range. Rather, a PIC may output optical signals over a relatively wide range of wavelengths but with relatively small changes in temperature.

Typically, for a given change in substrate temperature, the passbands of the AWG spectrally shift by the same amount as the optical signal wavelengths. Thus, a carrier on a chip (COC) or thermoelectric cooler (TEC) may be provided to adjust the substrate temperature, and thereby simultaneously adjust the temperatures of the DFB lasers, as well as the AWG. Additional heaters may further be provided to fine tune individual optical signal wavelengths, but such fine tuning is carried out over a narrow temperature range and can therefore be readily controlled. Accordingly, the wavelengths of the optical signals output from the lasers may be easily changed by simply changing the temperature of the substrate upon which the lasers and the AWG are provided, followed by minor temperature adjustments of each laser. Complicated, independent control of each laser and the substrate is unnecessary so that the lasers can be tuned over a wide range in a simplified manner.

FIG. 1 is a block diagram that conceptually illustrates components of an example optical communication system 100.

As shown, communication system 100 may include a first rack, cabinet, chassis, blade, or housing 110, which may include an optical transmitter 115. Although a single optical transmitter 115 is illustrated as being included in housing 110, in alternative implementations, multiple optical transmitters may be included in a single housing 110. Optical transmitter 115 may include a number of transmitter blocks (TX) 120-1 to 120-N (referred to collectively as "transmitter blocks 120" or individually as "transmitter block 120"), each of which may receive a corresponding one of information streams DATA-1 to DATA-N, modulate the information streams with an optical signal, and output one or more optical signals or channels to a combiner or multiplexer 125. Each transmitter block 120 may include, for example, one or more optical sources (e.g., lasers), optical couplers, modulators, and/or other components, to modulate the respective input information stream DATA-1 to DATA-N with one or more optical carrier signals. In one implementation, each of transmitter blocks 120 may have the same or similar structure.

Multiplexer 125 may include, for example, an AWG to optically multiplex its input signals. Multiplexer 115 may receive a number of modulated optical signals and combine the optical signals for transmission at an output optical communication path 130 as a wavelength division multiplexed (WDM) optical signal. As used herein, an optical signal may refer to the WDM optical signal, as well as each optical signal included in the WDM optical signal.

Optical communication path 130 may include one or more segments of optical fiber and optical amplifiers 135, for example, to optically amplify or boost the power of the transmitted optical signals. In one example, optical signals output to optical communication path 130 may be polarization multiplexed optical signals that are modulated in accordance with a known modulation format, such as quadrature phase shift keying (QPSK), binary phase shift keying (BPSK) or combinations of such modulation formats, e.g., certain optical signals may have a first modulation format, while others may have a second, different modulation format.

As further shown in FIG. 1, a receive node is provided that may include a second rack, cabinet, chassis, or housing 140, which may include one or more optical receivers 145. An optical splitter or demultiplexer 150, provided in optical receiver 145, may supply multiple output optical signals to a corresponding one of receiver blocks (RX) 155-1 to 155-N (referred to collectively as "receiver blocks 155" or individually as "receiver block 155"). In one implementation, demultiplexer 150 may include an AWG. Each of receiver blocks 155-1 to 155-N, in turn, may supply a corresponding copy of data or information streams DATA-1 to DATA-N in response to the optical signals. It is understood that each of transmitter blocks 120 may have the same or similar structure and each of receiver blocks 155 may have the same or similar structure.

Although FIG. 1 shows example components of optical communication system 100, in other implementations, optical communication system 100 may contain fewer components, different components, differently arranged components, and/or additional components than those depicted in FIG. 1. Alternatively, or additionally, one or more components of optical communication system 100 may perform one or more other tasks described as being performed by one or more other components of optical communication system 100.

Figure 2:
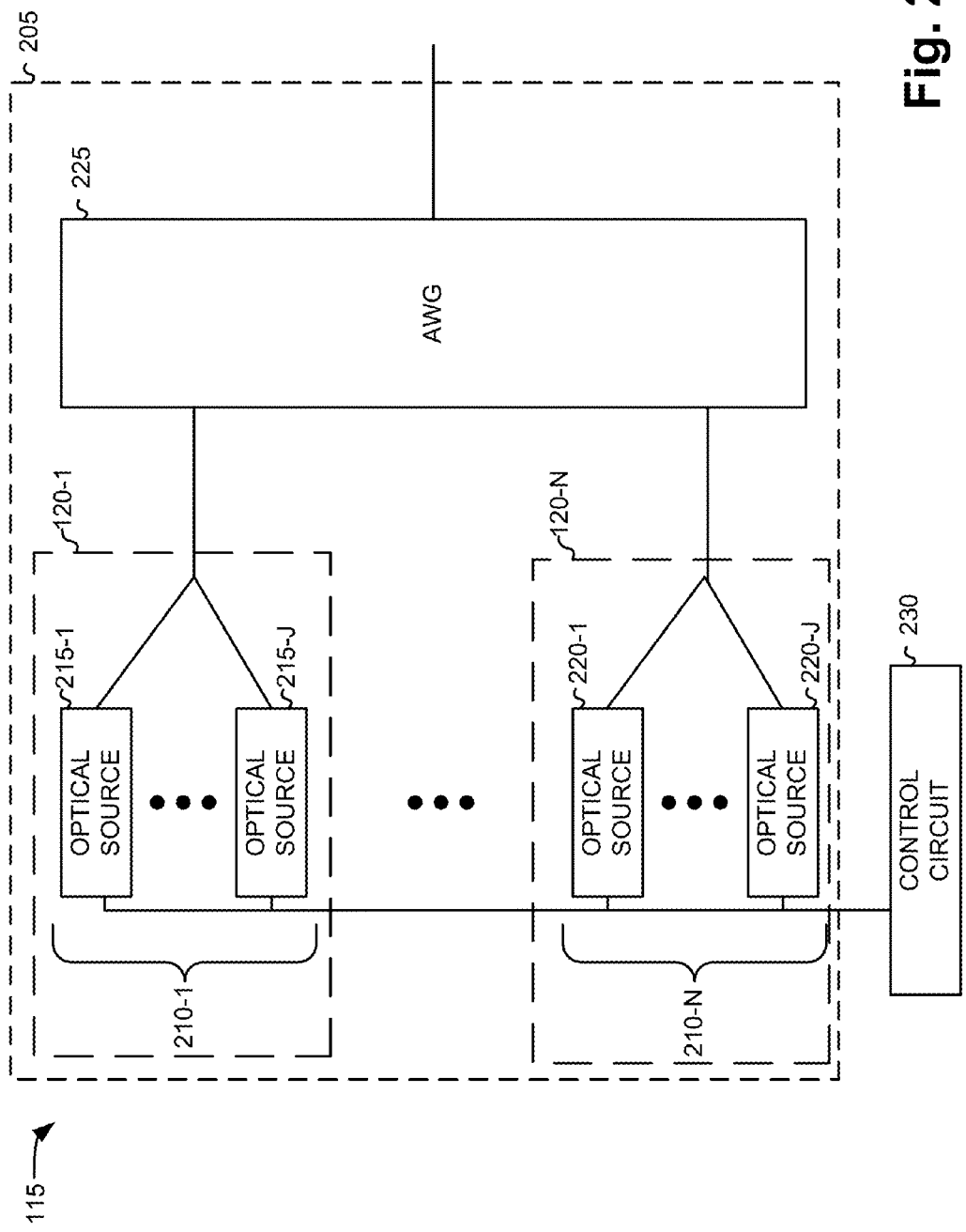
FIG. 2 is a diagram illustrating an example of components of an optical transmitter.

FIG. 2 is a diagram illustrating an example of components of optical transmitter 115. Transmission blocks 120 are particularly shown in more detail in FIG. 2. Transmission blocks 120 of optical transmitter 115 may include a number of components, such as groups of optical sources 210-1 through 210-N (referred to collectively as "optical sources 210" or individually as "optical source 210"). Multiplexer 125 is illustrated in FIG. 2 as AWG 225. The groups of optical sources 210 and AWG 225 may be provided on a substrate 205. Substrate 205 may include indium phosphide (InP) or another semiconductor material. Substrate 205 may be used to implement a photonic integrated circuit (PIC).

Each group of optical sources 210 may connect or supply optical signals to AWG 225. Each group may include a pair of optical sources (although more than two optical sources are contemplated and are within the scope of this disclosure), such as optical sources 215-1 and 215-J (referred to collectively as "optical sources 215" or individually as "optical source 215") as well as optical sources 220-1 and 220-J (referred to collectively as "optical source 220" or individually as "optical source 220"). In one implementation, each optical source may be a DFB laser designed to produce light at a particular frequency. The frequency produced by each optical source 215/220 within a pair of optical sources 210 may differ. In one implementation, optical sources 215-1 and 215-J supply light at first and second wavelengths, respectively, that are spectrally spaced from one another by the FSR of AWG 225. Similarly, optical sources 220-1 and 220-J may also produce light at frequencies that are offset from one another by the free spectral range (FSR) of AWG 225.

In one example, the FSR of the AWG is equal to 500 GHz, N=10 (i.e., there are ten pairings of optical sources 210). In this case, each optical source within a pair may be spectrally spaced by 500 GHz (e.g., optical source 215-1 and optical source 215-2 may generate light or optical signals at frequencies that are separated by 500 GHz). Corresponding optical sources across groups of optical sources 210 may provide optical signals having frequencies spaced by 25 GHz (250 GHz/10). For example, the first optical source in pairing 210-1 may output light having a frequency that is 25 GHz below the frequency of the light output from the first optical source in pairing 210-2, and the first optical source in pairing 210-2 may supply light having a frequency that is 25 GHz below the frequency of the first optical source in group 210-3, etc. In addition, not all pairings need to include an activated laser, such that the lasers of some pairings may be deactivated. As a result, the spacing between the wavelengths of the optical signals in the combined output from AWG 225 may be relatively wide. Other wavelength spacings are contemplated whereby the first optical source in some pairings is selected, while the second optical source in others is selected.

AWG 225 may include a group HIV material that is compatible with substrate 205, for example, In one embodiment, AWG 225 includes InP based ternary compounds. AWG 225 may include a number of input and output couplers, dielectric slabs, and intermediate waveguides. An example implementation of AWG 225 is discussed in more detail below with reference to FIG. 4.

As is further shown in FIG. 2, a control circuit 230 may be additionally included. Control circuit 230 may include logic to control the operation state of optical sources 215 and 220. For example, control circuit 230 may include a processor, a microprocessor, an application specific integrated circuit (ASIC), or another type of logic, to selectively enable and disable optical sources 215 and 220. Consistent with aspects described herein, control circuit 230 may select one optical source 215/220 from each optical source group 210. For example, control circuit 230 may turn on one optical source in each optical source group 210 (e.g., by enabling power to a selected optical source) and turn off the other optical sources in each optical source group 210 (e.g., by disabling power to the non-selected optical sources).

In one implementation, control circuit 230 may be programmed during manufacture or during provisioning of optical communication system 100 to select certain ones of optical sources 215/220. For example, for an optical communication system that is designed to transmit signals having wavelengths in a first band, control circuit 230 may be provisioned to select the first optical source (e.g., optical source 215-1, 220-1, etc.) in each group of optical sources 210. In contrast, for an optical communication system that is designed to transmit optical signals having wavelengths in a second band, control circuit 230 may be provisioned to select the second optical source (e.g., optical source 215-2, 220-2, etc.) in each group of optical sources 210. In this manner, a single substrate and/or PIC may be manufactured with a large potential range of operating frequencies or wavelengths, such as those throughout the C-band.

Figure 3:
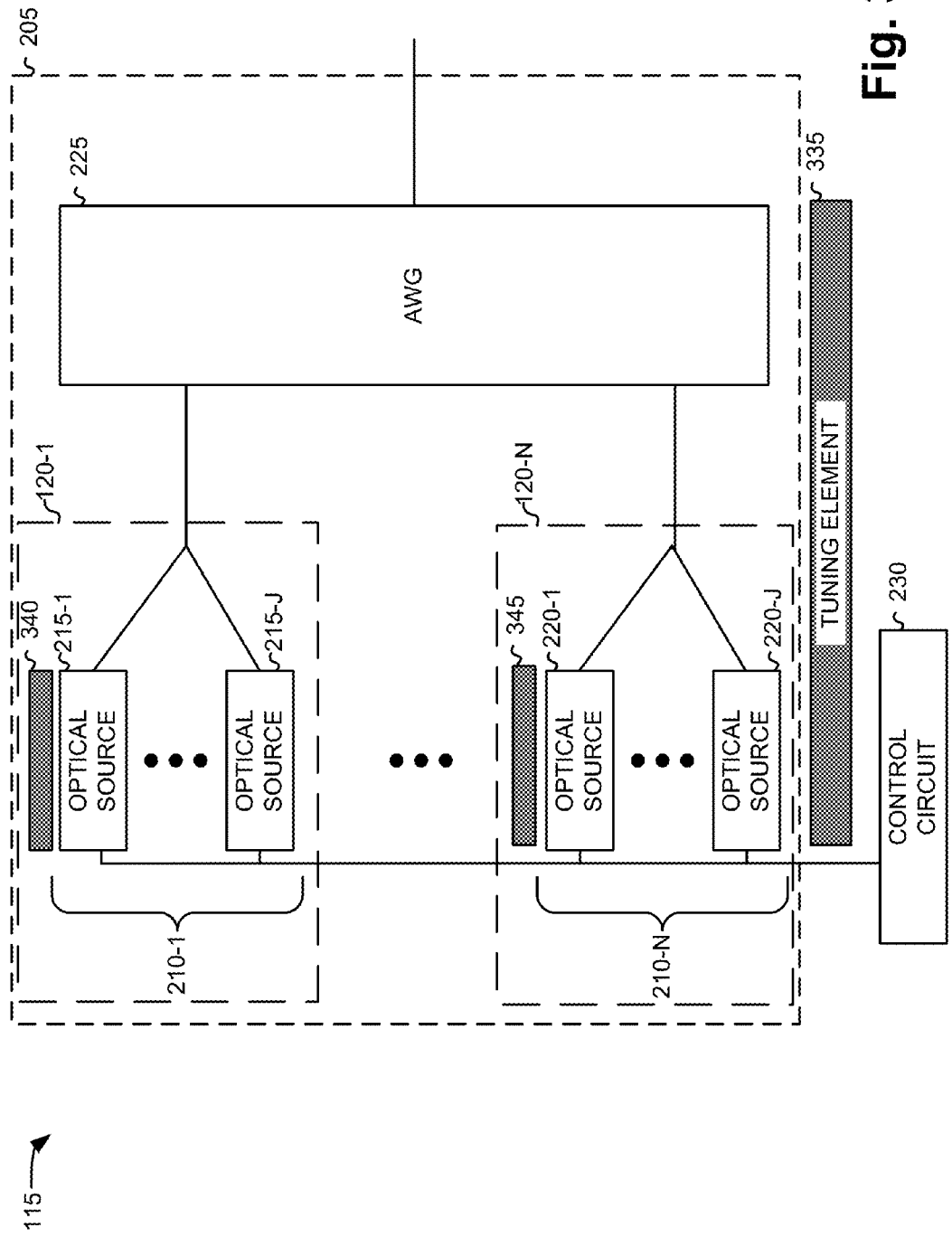
FIG. 3 is a diagram illustrating another example of components of an optical transmitter.

FIG. 3 is a diagram illustrating another example of components of an optical transmitter 115. Some components of FIG. 3 are similar to those of FIG. 2. Additionally, however, in FIG. 3, tuning elements 335, 340, and 345 are illustrated.

Tuning element 335 may be used to regulate the temperature of substrate 205, and thus tune optical sources 215/220 and AWG 225 together. Tuning element 335 may include, for example, a thin film heater, thermoelectric cooler (TEC), or a carrier on a chip (COC) heater. Tuning element 335 may be controlled by, for example, control circuit 230, to uniformly heat substrate 205. Heating substrate 205 may cause the light frequencies generated by optical sources 215/220 and the passband frequencies of AWG 225 to shift substantially uniformly. Thus, with tuning element 335, the operating frequencies of the components on substrate 205 may be tuned in a coarse-grained manner.

Tuning elements 340 and 345 may each be associated with individual groups of optical sources 210. Alternatively, each optical source 215/220 may be associated with an individual tuning element. Tuning elements 340 and 345 may include, for example, thin film heaters (e.g., including thin films of platinum, for example). Tuning elements 340 and 345 may be controlled by, for example, control circuit 230, which may supply an appropriate current and/or voltage to the thin film heater to independently tune optical sources 215/220 or a group of optical sources 210. Relative to tuning element 335, tuning elements 340/345 may include fine-grain tuning elements designed to cause small frequency shifts in the operation of optical sources 215/220. For example, tuning elements 340/345 may each include smaller thin film heaters that consume less power than tuning element 335.

In operation, in one implementation, control circuit 230 may control tuning element 235 to shift optical source groups 210 and AWG 225 to a desired band. Control circuit 230 may then use tuning elements 340/345 to fine tune the selected optical sources 215/220 to match the passbands of AWG 225.

Although FIGS. 2 and 3 show exemplary components of optical transmitter 115, in other implementations, optical transmitter 115 may contain fewer components, different components, differently arranged components, and/or additional components than those depicted in FIGS. 2 and 3. Alternatively, or additionally, one or more components of optical transmitter 115 may perform one or more other tasks described as being performed by one or more other components of optical transmitter 115.

Figure 4:
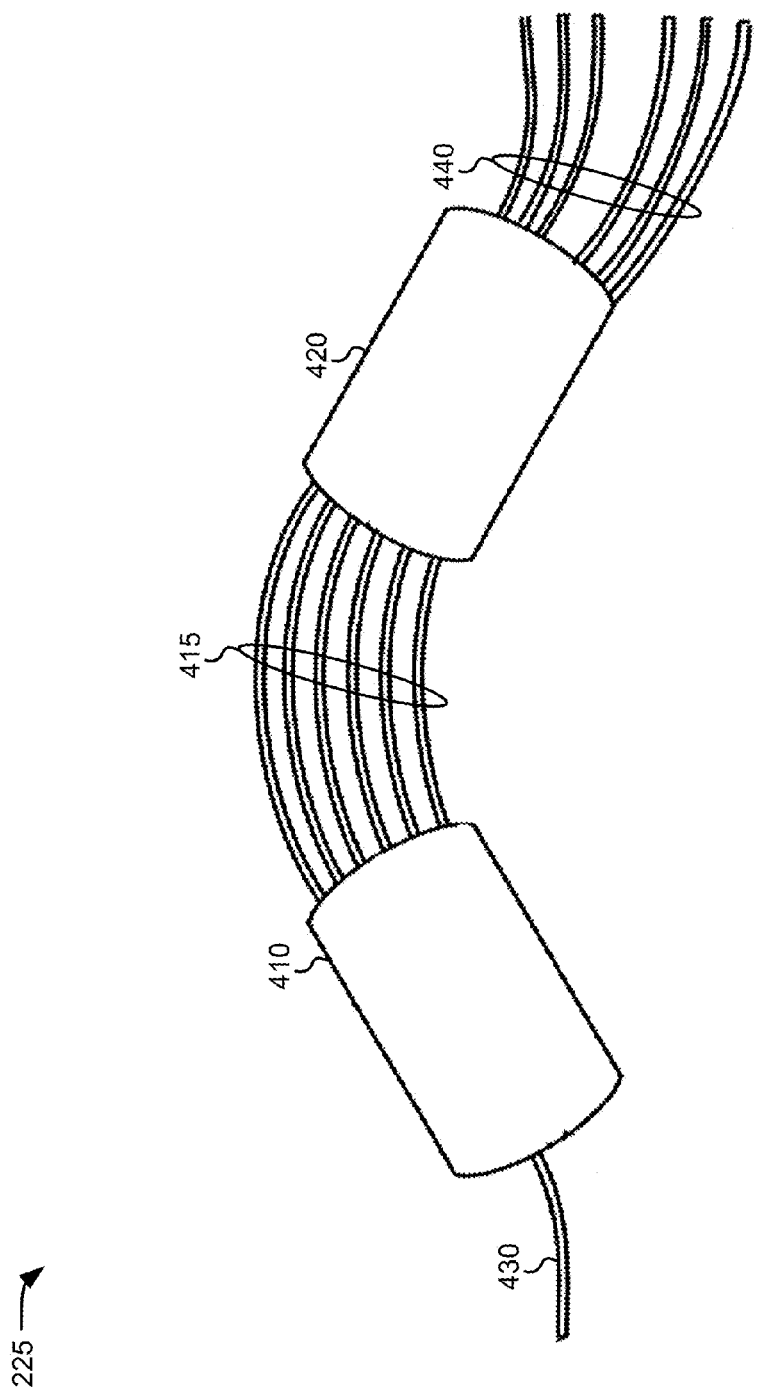
FIG. 4 is a diagram illustrating an example of an implementation of the arrayed waveguide grating (AWG) shown in FIG. 2.

FIG. 4 is a diagram illustrating an example of an implementation of AWG 225. AWG 225 may include a pair of free propagation regions, which may be implemented as dielectric slab waveguides 410 and 420. Slab waveguides 410 and 420 may be coupled to one another by a plurality of grating waveguides 415. Typically, each grating waveguide 415 may have a different length, and the lengths may be spaced from one another by predetermined amounts. A first set of input/output waveguides 430 (one waveguide 430 is illustrated) may be coupled to slab waveguide 410. A second set of input/output waveguides 440 (six waveguides 440 are illustrated) may be coupled to slab waveguide 420. Light may generally propagate in either direction through AWG 225. Thus, AWG 225 may act as an optical multiplexer, in which light is received at waveguides 440 and output through waveguide 430, or as an optical de-multiplexer, in which light is received at waveguide 430 and output through waveguides 440.

When operating as a multiplexer, each input waveguide 440 may be designed to accept light or an optical signal having a particular frequency or wavelength or very narrow range of frequencies or wavelengths (called the passband for the waveguide 440), where the various optical signals on each of input waveguides 440 may be offset from one another.

Figure 5:
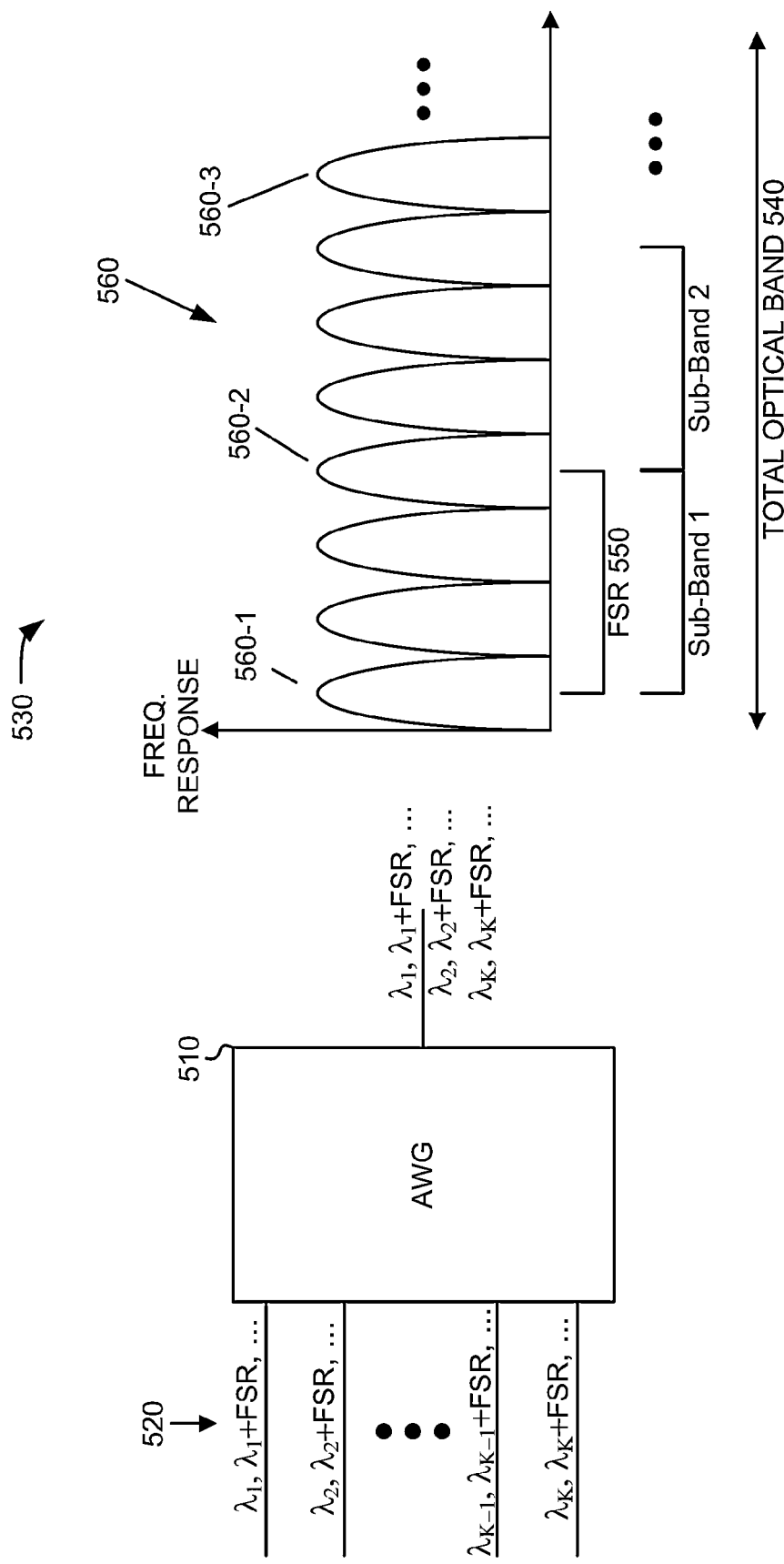
FIGS. 5A and 5B are diagrams conceptually illustrating a cyclic AWG.

Additionally, AWG 225 may be configured as a cyclic AWG, as discussed in greater detail below with reference to FIGS. 5A and 5B.

FIGS. 5A and 5B conceptually illustrate a cyclic AWG. In FIG. 5A, an AWG 510 is illustrated as a multiplexer in which input waveguides 520 are each associated with a number of passbands that are offset from one another by the FSR of AWG 510. For instance, the first waveguide of waveguides 520 may be designed to pass light having wavelengths substantially equal $\lambda_1$, $\lambda_1$+FSR, $\lambda_1$+2FSR, $\lambda_1$+3FSR, etc. Similarly, the second waveguide of waveguides 520 may be designed to pass light having wavelengths substantially equal to $\lambda_2$, $\lambda_2$+FSR, $\lambda_2$+2FSR, $\lambda_2$+3FSR, etc. Here, $\lambda_1$ and $\lambda_2$ may be offset by less than the full FSR. Here, it is assumed that AWG 510 has a relatively high order, such as an order that is greater than 100.

FIG. 5B is a diagram conceptually illustrating the frequency response or transmission characteristic of AWG 510 over all of input waveguides 520 (e.g., frequency response curves corresponding to four waveguides are illustrated in FIG. 5B). Frequency response 530 is illustrated as covering a band, labeled as total optical band 540. Total optical band 540 may represent the entire frequency or wavelength range over which AWG 225 (and hence optical communication system 100) may operate. Total optical band 540 may correspond to, for example, the optical C-band. Within total optical band 540, selected transmission peaks 560 are spectrally spaced apart from each other by FSR 550, e.g., peaks 560-1, 560-2, and 560-3. In addition, peaks 560 may be grouped into bands (Band 1, Band 2, etc.) and each band may have a width that is equal to FSR 550 Each peak 560 may correspond to the frequency (or wavelength) of minimum attenuation of the input optical signal.

In one implementation, FSR 550 may be 500 GHz, and in another example it is 250 GHz. Total optical band 540 may cover, for example, approximately 1 THz, such that at least four bands (two of which are shown as Band 1 and Band 2) are included in total optical band 540. In one implementation, control circuit 230 may select various optical sources 215/220 in each pairing to provide optical signals having wavelengths that are in different bands, such that some optical signals have wavelengths in Band 1 and others have wavelengths in band 2.

Figure 6:
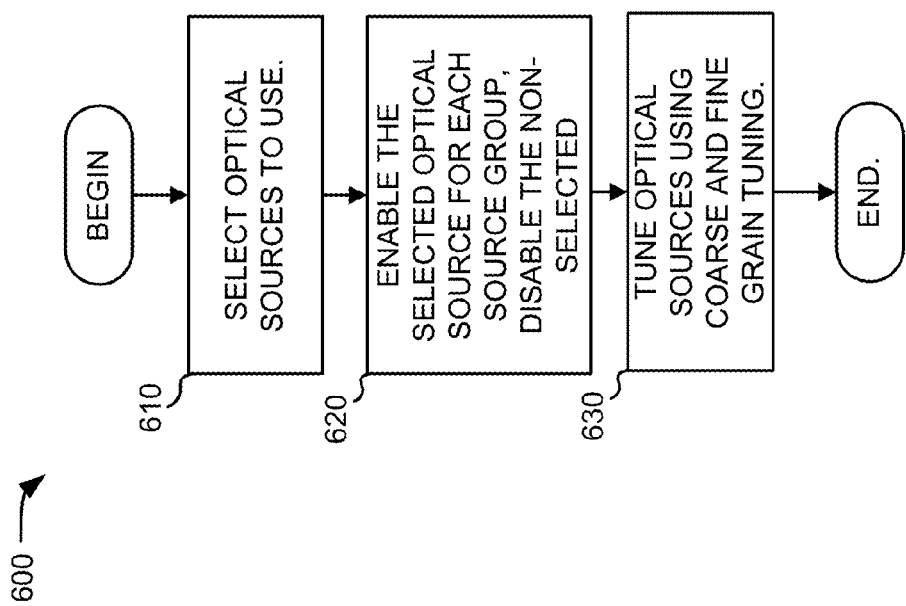
FIG. 6 is a flow chart illustrating an example of operations for tuning an optical transmitter.

FIG. 6 is a flow chart illustrating an example of operations 600 for tuning optical transmitter 115. Similar operations may apply to the tuning of an optical receiver 145. In general, optical transmitters 115 and optical receivers 145 may be tuned to match one another. In one implementation, process 600 may be performed by control circuit 230.

Process 600 may include selecting the optical sources for transmission (block 610). In one implementation, the optical sources to select may be programmed into control circuit 230 during manufacture, provisioning, or installation of optical communication system 100. One optical source 215/220, from each optical source group 210, may be selected. For example, the optical sources to select may be stored in computer-readable memory or controlled via settable fuses.

The optical sources to use may be selected based on the desired carrier frequencies for the WDM optical signals that are to be used to carry information. For example, optical signals having wavelengths in different bands (e.g., Band 1 and Band 2) may be desired.

Process 600 may further include enabling the selected optical sources and disabling the non-selected optical sources (block 620). For example, power may be applied to the selected optical sources 215/220 but not supplied to the non-selected optical sources 215/220. In other implementations, other techniques for enabling/disabling optical sources 215/220 may be used.

Process 600 may further include tuning the optical sources (block 630). In implementations in which a coarse-grain tuning element, such as tuning element 335, and fine-grain tuning elements, such as tuning elements 340/345, are available, block 630 may include tuning all of the optical sources 215/220 and AWG 225 (i.e., coarse-grain tuning), such as by heating substrate 205, to a desired level, and then tuning individual optical sources (i.e., fine-grain tuning), such as by individually further heating the optical sources 215/220. Heating substrate 205 may be used to shift the wavelengths of light supplied by the optical sources while individually heating the optical sources 215/220 may be used, for example, to center optical sources 215/220 on the corresponding passband frequency (e.g., humps or peaks 560 in FIG. 5B).

Figure 7:
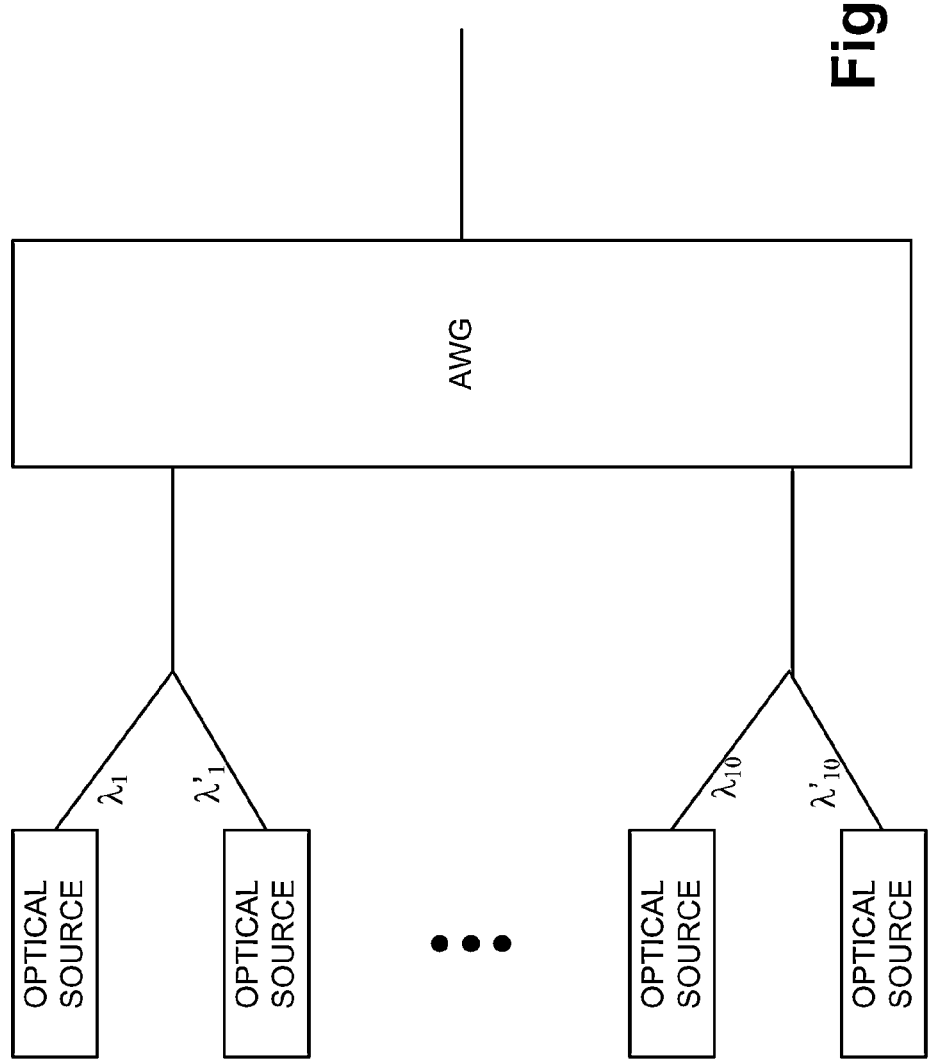
FIG. 7 is a diagram illustrating portions of a particular implementation of an optical transmitter.

An example of wavelength tuning in accordance with process 600 will next be discussed with reference to FIGS. 7 and 8. FIG. 7 is a diagram illustrating portions of a particular implementation of optical transmitter 115. In the exemplary implementation of FIG. 7, twenty optical sources (e.g., lasers) may be arranged, on a PIC, as ten groups of two lasers per group, where the two lasers in a group are labeled as $\lambda$ and $\lambda'$ (e.g., $\lambda_1$ and $\lambda'_1$). One laser from each group, for a total of ten active lasers, may be enabled.

Figure 8:
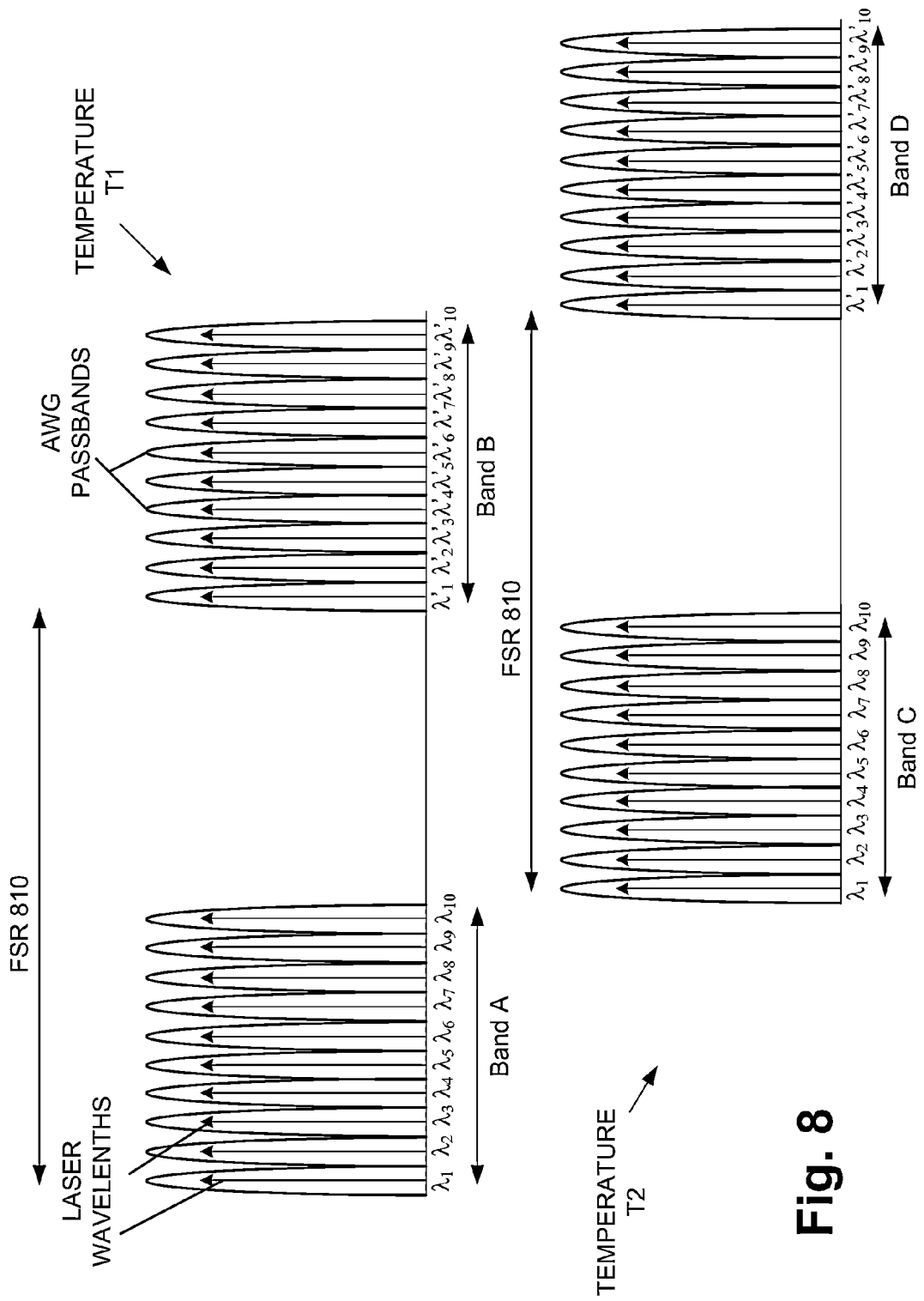
FIG. 8 is a diagram illustrating potential frequency responses of the implementation of the optical transmitter shown in FIG. 7.

FIG. 8 is a diagram illustrating potential AWG passbands and optical signal wavelengths of the implementation shown in FIG. 7. The optical transmitter of FIG. 7 may potentially transmit optical signals having wavelengths in any one of four bands, Bands A-D. Band A, corresponding to the AWG passbands and laser wavelengths in the upper left corner of FIG. 8, may be obtained when the first laser in each group (laser $\lambda_n$) is selected and tuning element 335 adjusts the temperature of AWG and lasers to be at temperature T1. Band C, corresponding to the AWG passbands and laser wavelengths in the lower left of FIG. 8, may be obtained when the first laser in each group (laser $\lambda_n$) is selected and tuning element 335 is used to thermally tune all of the optical sources and the AWG to have temperature T2. When tuning element 335 is a COC, Band A may correspond to the heater being off or in a low heating state (temperature T1) and Band C may correspond to the Coc being on or in a higher heating state (temperature T2). Similarly, Band B, corresponding to the AWG passbands and optical signal wavelengths shown in the upper right of FIG. 8, may be obtained when the second laser in each group (laser $\lambda'_n$) is selected and tuning element 335 thermally tunes all of the optical sources and the AWG to have temperature T1. Similarly, Band D, corresponding to the AWG passbands and optical signal wavelengths shown in the lower right corner of FIG. 8, may be obtained when the second laser in each group (laser $\lambda'_n$) is selected and tuning element 335 thermally tunes optical sources and the AWG to have temperature T2.

As shown in FIGS. 7 and 8, by using two lasers per group of optical sources, and a coarse tuning element capable of "moving" the optical source frequency between two adjacent bands, a PIC may be manufactured that is capable of operation over four bands, for example. Although FIGS. 7 and 8 were discussed in the context of all of the first optical sources (lasers $\lambda_n$) or all of the second optical sources (lasers $\lambda'_n$) being selected, in alternative possible implementations, some optical groups may have the first optical source selected while other optical groups may simultaneously have the second optical source selected, thus producing output optical signals that cover two different bands, e.g. Band A and Band B. In addition, more than two optical sources or lasers may be provided instead of a pairing and the optical sources in each such group may be selected in a manner similar to that described above.

The optical transmitter 115, as discussed above with respect to FIGS. 2-6, may be implemented in accordance with various possible configurations of optical and/or electrical components. Several exemplary implementations will next be discussed with respect to FIGS. 9-11.

Figure 9:
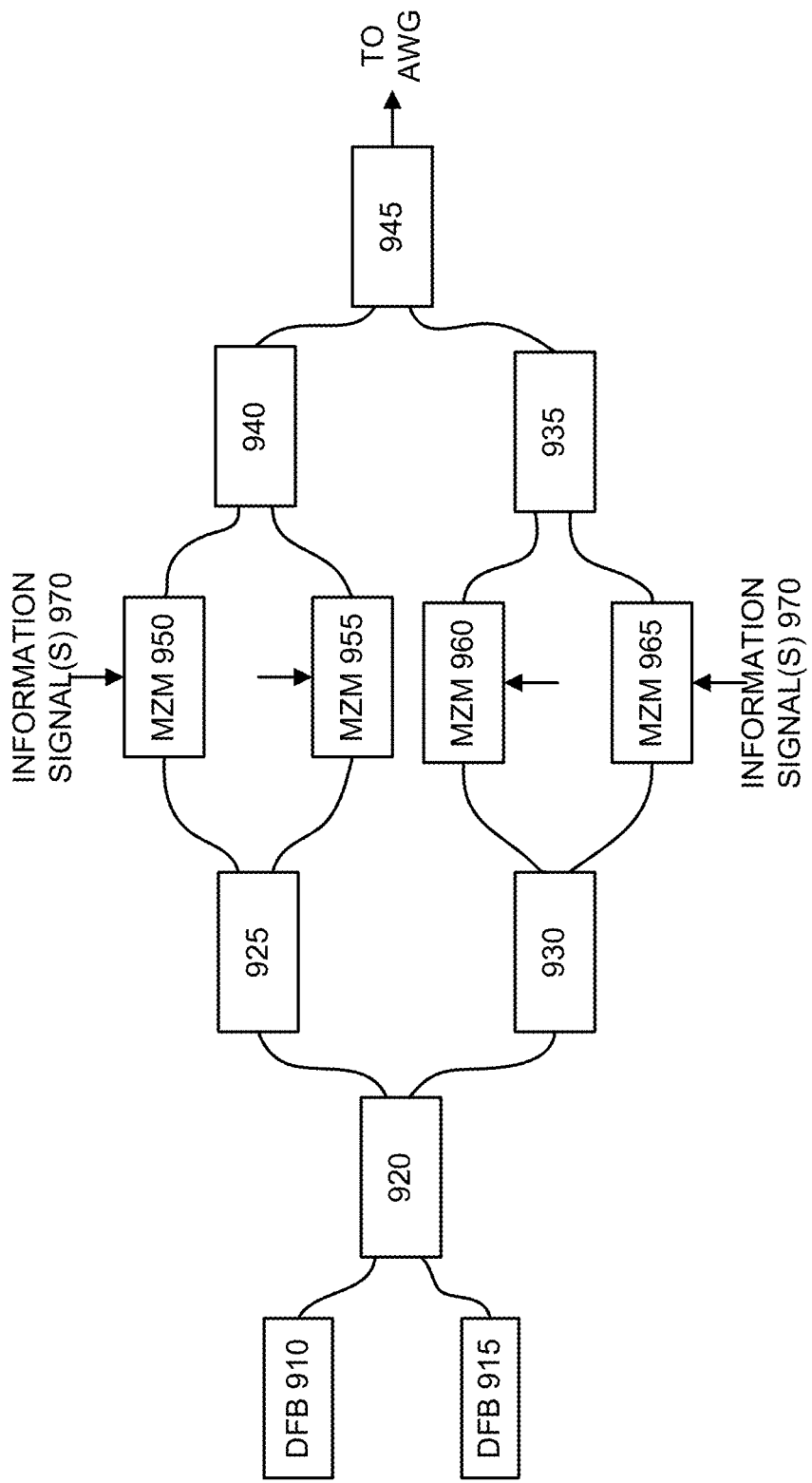
FIG. 9 is a diagram illustrating one example implementation of an optical transmitter block.

FIG. 9 is a diagram illustrating one example implementation of a transmitter block 120. For clarity, tuning elements 335, 340, and 345 are not illustrated in FIG. 9, but may, in certain implementations, be included.

As shown in FIG. 9, a pair of DFB lasers 910 and 915 may generate light that is transmitted through a number of optical splitters or couplers 920, 925, 930, 935, 940, and 945, and a number of Mach-Zehnder interferometers or modulators (MZMs) 950, 955, 960, and 965. The input information signal(s) that are to be modulated with the carrier wave optical signals from lasers 910/915 are shown as information signal(s) 970.

DFB lasers 910 and 915 may correspond to, as shown in FIGS. 2 and 3, local oscillator lasers 215/220, of a particular local oscillator laser group 210. As illustrated, coupler 920 may receive the output of one of lasers 910 or 915, and may provide a split optical signal to couplers 925 and 930, which may further split the optical signal into four signals, which may be provided to MZMs 950, 955, 960, and 965. The output of MZMs 950, 955, 960, and 965 may be combined by couplers 935 and 940, and then by coupler 945, for output to AWG 225, for wave division multiplexing.

Optical couplers 920, 925, 930, 935, 940, and 945 may each include 2×2 or 2×1 multi-mode interference optical couplers that act to receive light at input waveguides, mix or split the light, and output the light at output waveguides. Directional couplers may also be employed. In one implementation, each of couplers 920, 925, 930, 935, 940, and 945 may be a 2×2 coupler, in which those of the couplers that are shown with a single input port or output port may be 2×2 couplers in which one input/output port is not connected.

MZMs 950, 955, 960, and 965 may include, for example, InP based or other group HIV based materials noted above. In general, an MZM may operate by splitting an incoming optical signal and transmitting the split optical signal down two different paths. Delay, and hence a phase shift, in the optical paths, may be controlled by input information signal(s) 970.

Figure 10:
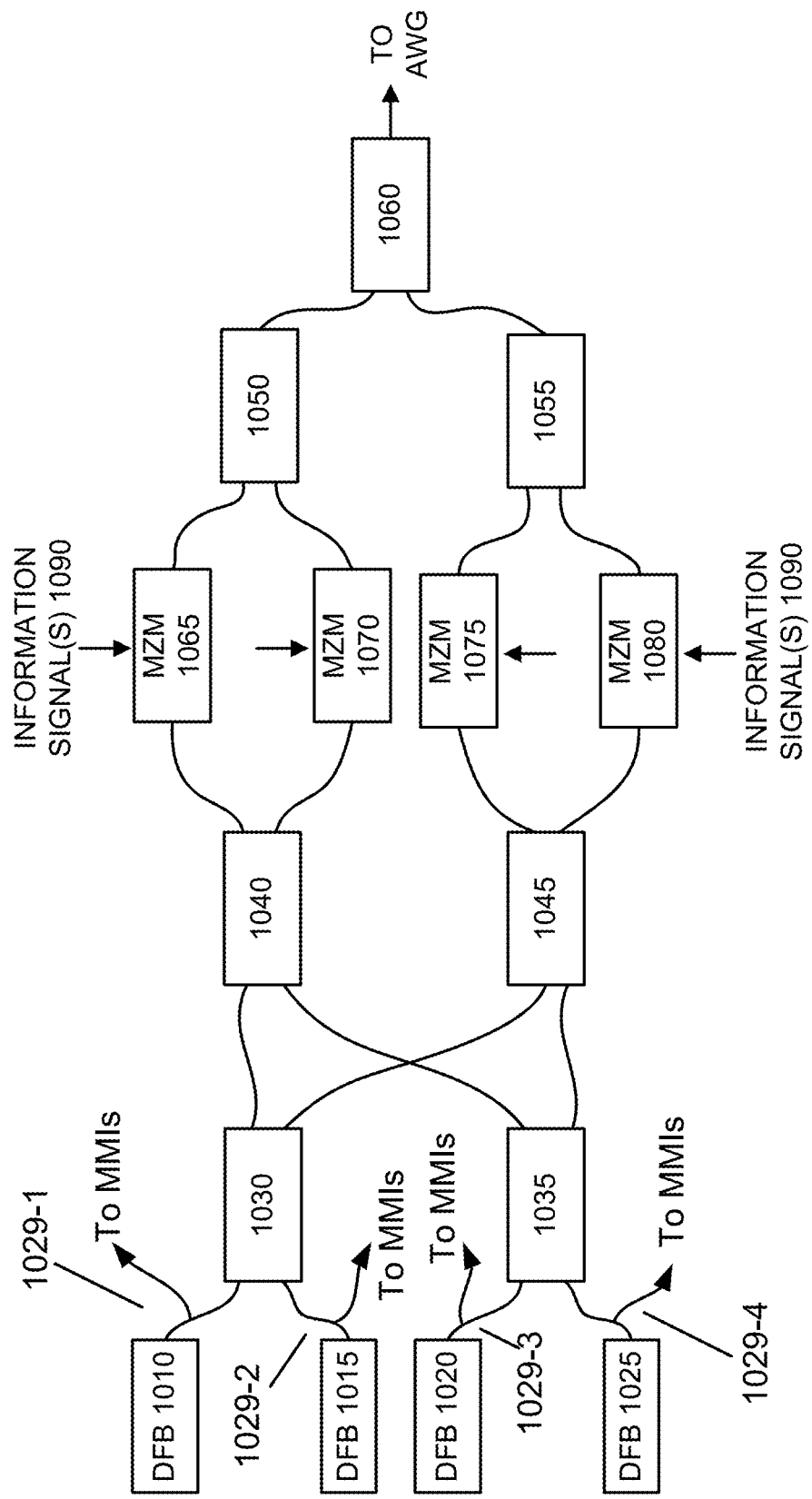
FIG. 10 is a diagram illustrating a second example implementation of an optical transmitter block.

FIG. 10 is a diagram illustrating a second example implementation of a transmitter block 120. The optical source group of FIG. 10 is similar to that of FIG. 9, except that four lasers are illustrated. For clarity, tuning elements 335, 340, and 345 are not illustrated in FIG. 10, but may, in certain implementations, be included.

As shown in FIG. 10, four DFB lasers 1010, 1015, 1020, and 1025 may generate light that is transmitted through a number of optical splitters or couplers 1030, 1035, 1040, 1045, 1050, 1055, and 1060 and a number of MZMs 1065, 1070, 1075, and 1080. Information signals 1090 are supplied to the MZMs so that the outputs from lasers 1010, 1015, 1020, and 1025 are modulated to carry the data associated with the information signals.

DFB lasers 1010, 1015, 1020, and 1025 may correspond to, as shown in FIGS. 2 and 3, optical sources 215/220, of a particular optical source group 210. As illustrated, coupler 1030 may receive the output of one of lasers 1010 or 1015, and may provide a split optical signal to couplers 1040 and 1045. Coupler 1035 may receive the output of one of lasers 1020 or 1025, and may provide a split optical signal to couplers 1040 and 1045. Couplers 1040 and 1045 may further split the optical signal into four signals (from one of lasers 1010, 1015, 1020, or 1025), which may be provided to MZMs 1065, 1070, 1075, and 1080. The output of MZMs 1065, 1070, 1075, and 1080 may be combined by couplers 1050 and 1055, and then by coupler 1060, for output to AWG 225 for wave division multiplexing.

Optical couplers 1030, 1035, 1040, 1045, 1050, 1055, and 1060, as with the optical couplers shown in FIG. 9, may each include 2×2 or 2×1 optical couplers that act to receive light at input waveguides, mix or split the light, and output the light at output waveguides. MZMs 1065, 1070, 1075, and 1080 may include, for example, lithium niobate mach-zehnder modulators.

As further shown in FIG. 10, the outputs of DFB lasers 1010, 1015, 1020, and 1025 may be split (with a known 3 dB coupler, for example) by splitters 1029-1 through 1029-4, and the split portions may be provided to a bank of MMI couplers (or further 3 dB couplers) and MZMs arranged in a manner shown in FIG. 10. The output of the additional bank of couplers and modulators may then be polarization rotated to have a TM polarization and provided to the AWG. A polarization beam combiner may further be provided before or after the AWG to combine the polarization rotated and non-rotated optical signals.

Figure 11:
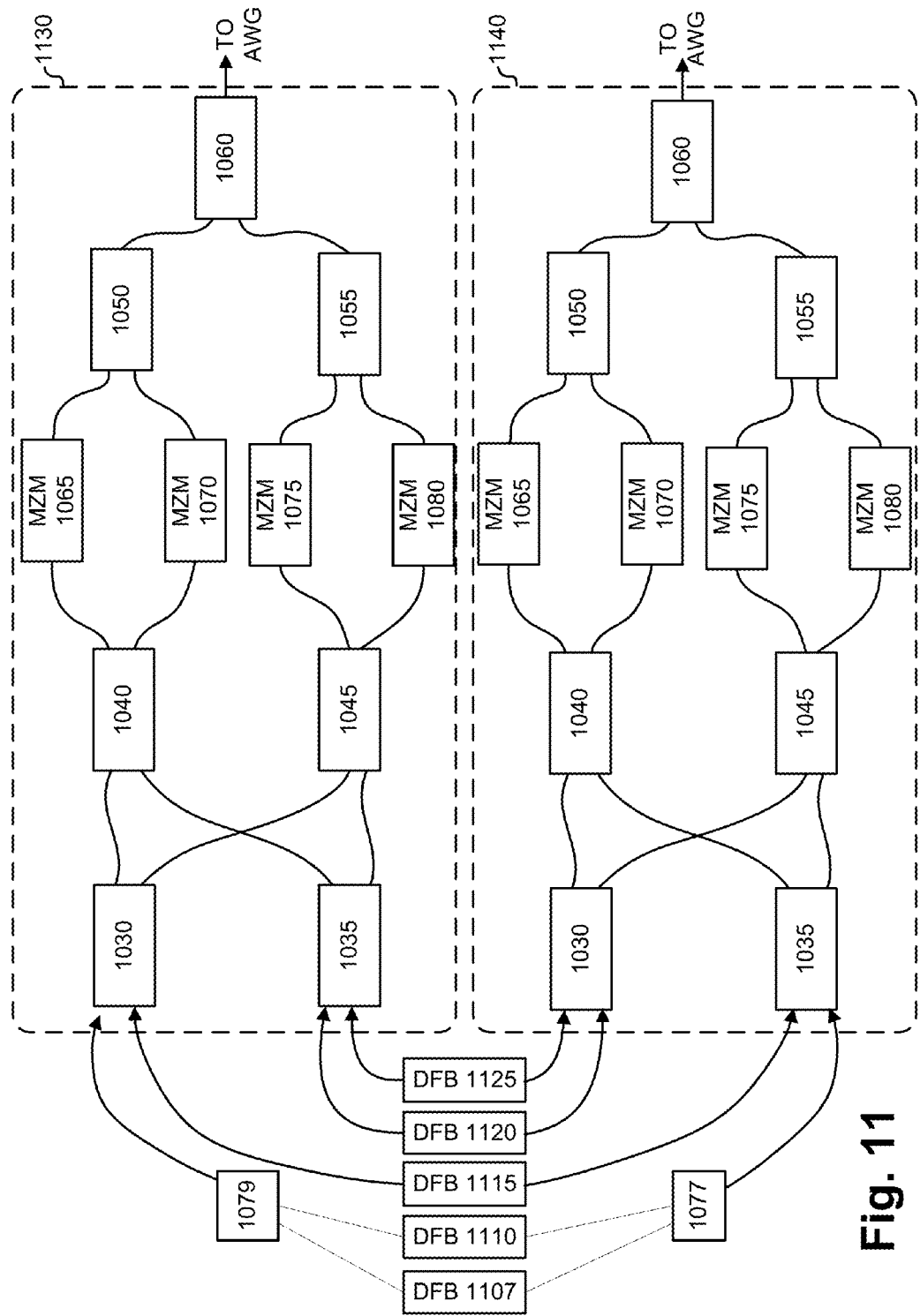
FIG. 11 is a diagram illustrating a third example implementation of an optical transmitter block.

FIG. 11 is a diagram illustrating a third example implementation of a transmitter block 120. The optical source group of FIG. 11 is similar to that of FIG. 10, except that four dual-output local oscillator lasers 1110, 1115, 1120, and 1125 are illustrated in place of the four single-sided local oscillator lasers (1010, 1015, 1020, and 1025) illustrated in FIG. 10. One output of each of dual-output lasers 1110, 1115, 1120, and 1125 may be input to coupler/MZM arrangement 1130 and the other output may be input to coupler/MZM arrangement 1140. Each of coupler/MZM arrangement 1130/1140 may correspond to the optical couplers and MZMs shown in FIG. 10. Coupler/MZM arrangements 1130 and 1140 may both output quadrature TE-mode output signals, and one of these signals may be polarization rotated to have a TM polarization. The rotated and non-rotated signals may then be combined with a polarization beam combiner. With the implementation shown in FIG. 11, dual-output lasers can be used to increase the bandwidth relative to the implementation of FIG. 10.

In a further example, four additional DFB lasers may be provided, and each of the additional DFB lasers may be paired with a corresponding one of DFB lasers 1110, 1115, 1120, and 1125. One such pair is shown as DFB 1107 and DFB 1110. The outputs of the sides of each DFB in each pair may be provided to couplers, such as couplers 1077 and 1079, which have outputs that feed into couplers 1030 and 1035, as discussed above.

In the example shown in FIG. 11, eight DFB lasers can be selected and temperature tuned to provide outputs at wavelengths that span a range of 8 THz. With four DFB lasers, the range is typically 4 THz.

Although FIGS. 9-11 show example components of a transmitter block 120, in other implementations, transmitter block 120 may contain fewer components, different components, differently arranged components, and/or additional components than those depicted in FIGS. 9-11. Alternatively, or additionally, one or more components of transmitter block 120 may perform one or more other tasks described as being performed by one or more other components of transmitter block 120.

Optical receiver 145 may include optical sources, such as local oscillator lasers, to generate light at frequencies corresponding to the optical sources of optical transmitter 115. At optical receiver 145, the light generated by the optical sources may be mixed with the light received over communication path 130 as part of the demodulation to generate the information streams DATA-1 to DATA-N.

Figure 12:
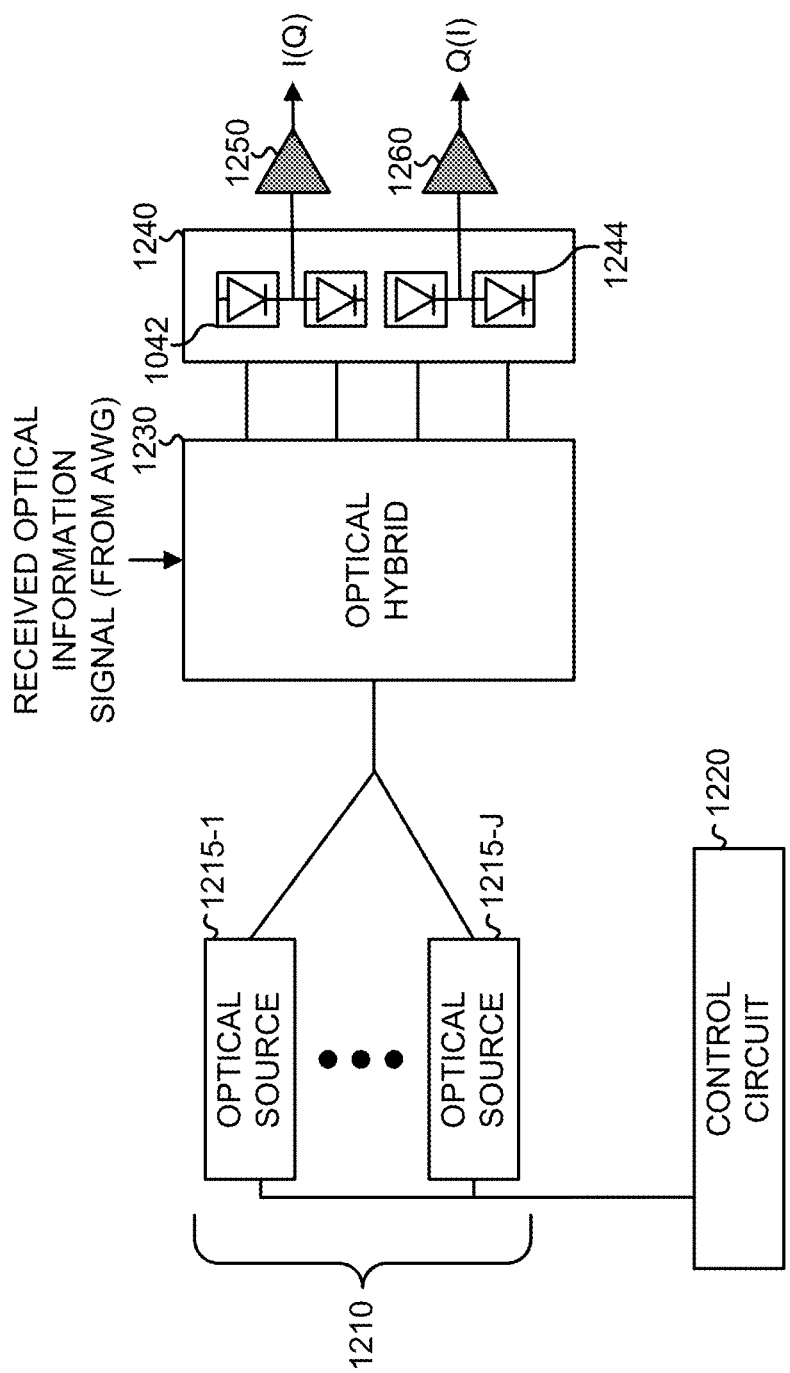
FIG. 12 is a diagram illustrating an example of components of an optical receiver.

FIG. 12 is a diagram illustrating an example of components of receiver block 155 of an optical receiver 145. Each receiver block 155 of optical receiver 145 may include a number of components, such as groups of optical sources, similar to groups of optical sources 210, as discussed with respect to FIG. 2. In FIG. 12, one group of optical sources 1210, potentially corresponding to the optical sources for one receiver block 155, is illustrated. Control circuit 1220 may select one optical source from a group of optical sources. The optical signal from the selected optical source 1215 may be input to an optical hybrid 1230, which may output a number of signals to balanced detector 1240. Balanced detector 1240 may convert optical signals, output from optical hybrid 1230, to electrical signals, which may be amplified by amplifiers 1250 and 1260 and converted to digital signals corresponding to the desired information streams.

Group of optical sources 1210 may include optical sources 1215-1 through 115-J (referred to collectively as "optical sources 1215" or individually as "optical source 1215"). In one implementation, each optical source 1215 may be a DFB laser designed to produce light at a particular frequency. The frequency produced by each optical source 1215 within a group of optical sources 1210 may differ. In one implementation, each optical source 1215 within a group of optical sources 1210 may produce light at a frequency that is offset from one another by the FSR of de-multiplexer 150 (FIG. 1), which may include an AWG.

Control circuit 1220 may include logic to control the operation state of optical sources 1215. For example, control circuit 1220 may include a processor, a microprocessor, an application specific integrated circuit (ASIC), or another type of logic, to selectively enable and disable optical sources 1215. Consistent with aspects described herein, control circuit 1215 may select one optical source 1215 from optical source group 1210. Accordingly, optical receiver 145 can be tuned to detect data carried by optical signals having one of a plurality of wavelengths and is not limited to detecting data carried by an optical signal having only one wavelength.

Optical hybrid 130 may include a known 90 degree optical hybrid circuit and may perform coherent signal demodulation based on the received optical information signal (i.e., the optical signal received over communication path 130, and potentially split by de-muiltiplexer 150) and based on the locally generated optical signal from one of optical sources 1215. In general, optical hybrid 1230 may mix the optical information signal with the locally generated optical signal. Optical hybrid 1230 may output four light signals to balanced detector 1240.

Balanced detector 1240 may include two pairs of balanced photodiodes, illustrated as photodiode pairs 1242 and 1244. Each pair of photodiodes 1242/1244 may generally act to receive a pair of optical signals from optical hybrid 1230 and generate an output signal, in the electrical domain, corresponding to the received information-carrying optical signal.

Amplifiers 1250/1260, which may include transimpedance amplifier circuits, may amplify the signals, output from balanced detector 1240. The amplified signals may be digitized and then processed by, for example, a digital signal processor, to extract the original information signals (e.g., DATA-1 through DATA-N).

In operation, optical receiver 145 and/or optical receive blocks 155 may be configured and/or tuned in a manner similar to the tuning of optical transmitter 115. Thus, control circuit 1220 may select one optical source from each of a number of groups of optical sources 1210. In some implementations, a coarse-grain tuning element, such as a thin-film heater, may be used to shift the spectral operating range of optical receiver 145 while smaller, fine-grain tuning, may be performed with tuning elements, such as heaters, associated with each optical source group 1210 or each optical source 1215.

Although FIG. 12 shows example components of an optical receiver 145, in other implementations, optical receiver 145 may contain fewer components, different components, differently arranged components, and/or additional components than those depicted in FIG. 12. Alternatively, or additionally, one or more components of optical receiver 145 may perform one or more other tasks described as being performed by one or more other components of optical receiver 145.

Optical receiver 145, as illustrated in FIG. 12, may be implemented using a number of potential configurations of optical and/or electrical components. Two exemplary implementations will next be discussed with reference to FIGS. 13 and 14.

Figure 13:
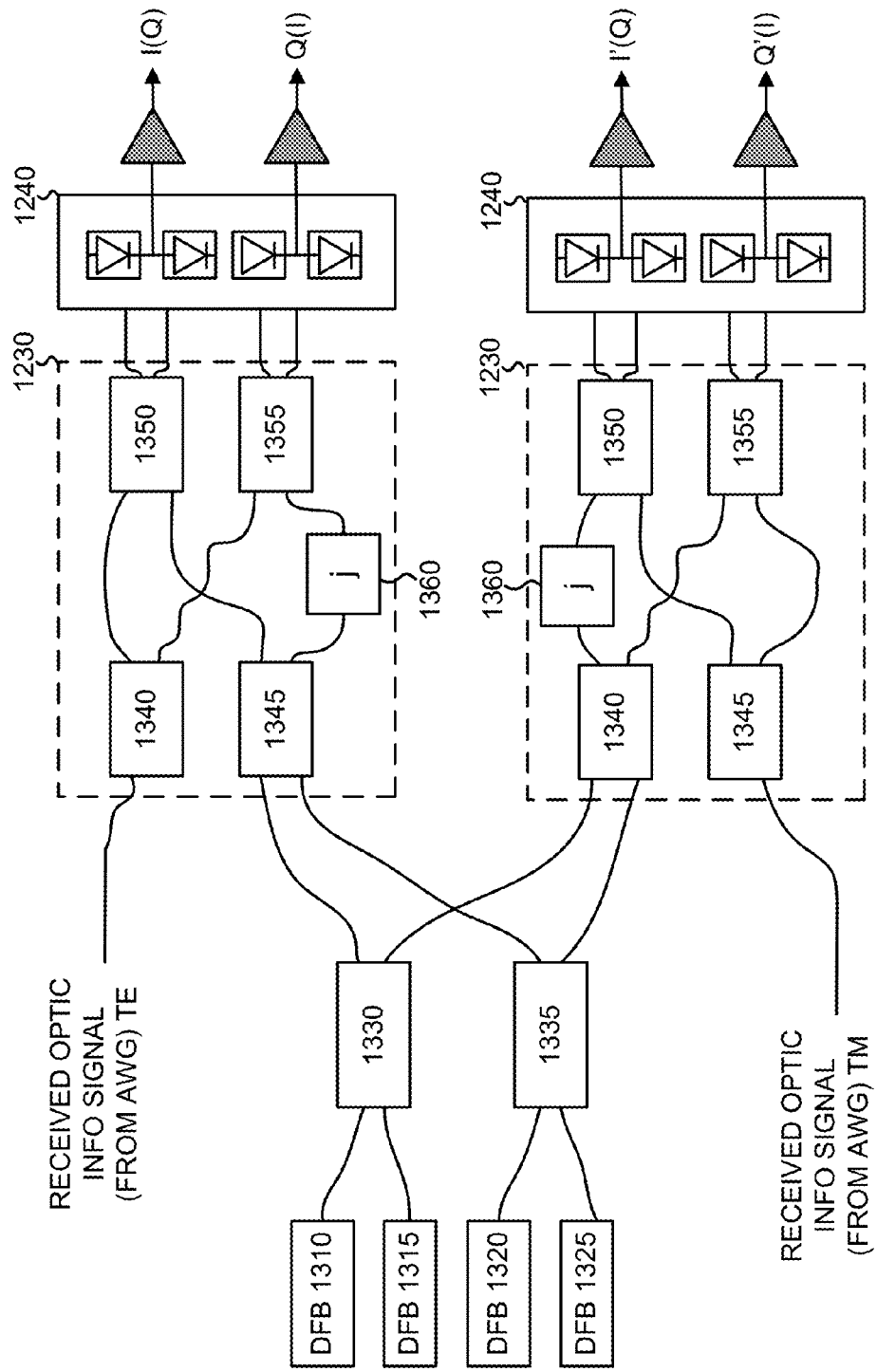
FIG. 13 is a diagram illustrating one example of an implementation of an optical receiver.

FIG. 13 is a diagram illustrating one example implementation of an optical receiver 145. For clarity, tuning elements, such as tuning elements similar to tuning elements 335, 340, and 345 are not illustrated in FIG. 13, but may, in certain implementations, be included.

As shown in FIG. 13, four DFB lasers 1310, 1315, 1320, and 1325 may operate with optical couplers 1330 and 1335, to provide an input to two optical hybrids 1230 and two corresponding balanced detectors 1240. Lasers 1310, 1315, 1320, and 1325 may generate light that is transmitted through optical splitters/couplers 1330 and 1335. Control circuit 1220 may control, at any particular time, one of lasers 1310, 1315, 1320, and 1325 to be enabled while the other ones are not enabled. As shown, optical couplers 1330 and 1335 may thus operate to supply light from the enabled laser to each of optical hybrids 1230. A second input to each of optical hybrids 1230 may include the received optic information signal, such as the signal received over communication path 130. The received optical information signal may be de-multiplexed, by de-multiplexer 150 (e.g., an AWG), before being input to optical hybrids 1230.

Each of optical hybrids 1230 are shown as including four optical couplers 1340, 1345, 1350, and 1355, and a phase shift element 1360. In one implementation, optical couplers 1340, 1345, 1350, and 1355 may include, for example, 2×2 optic couplers and phase shift element 1360 may include a 90 degree phase shifter.

Optical couplers 1330 and 1335 (as well as couplers 1340 and 1345) may include known multi-mode interference (MMI) couplers. Such couplers have "ports" through which optical signals may be input to or output from the couplers. In the example shown in FIG. 13, each port of couplers 1330, 1335, 1340, and 1345 is efficiently connected to either supply or receive light.

Figure 14:
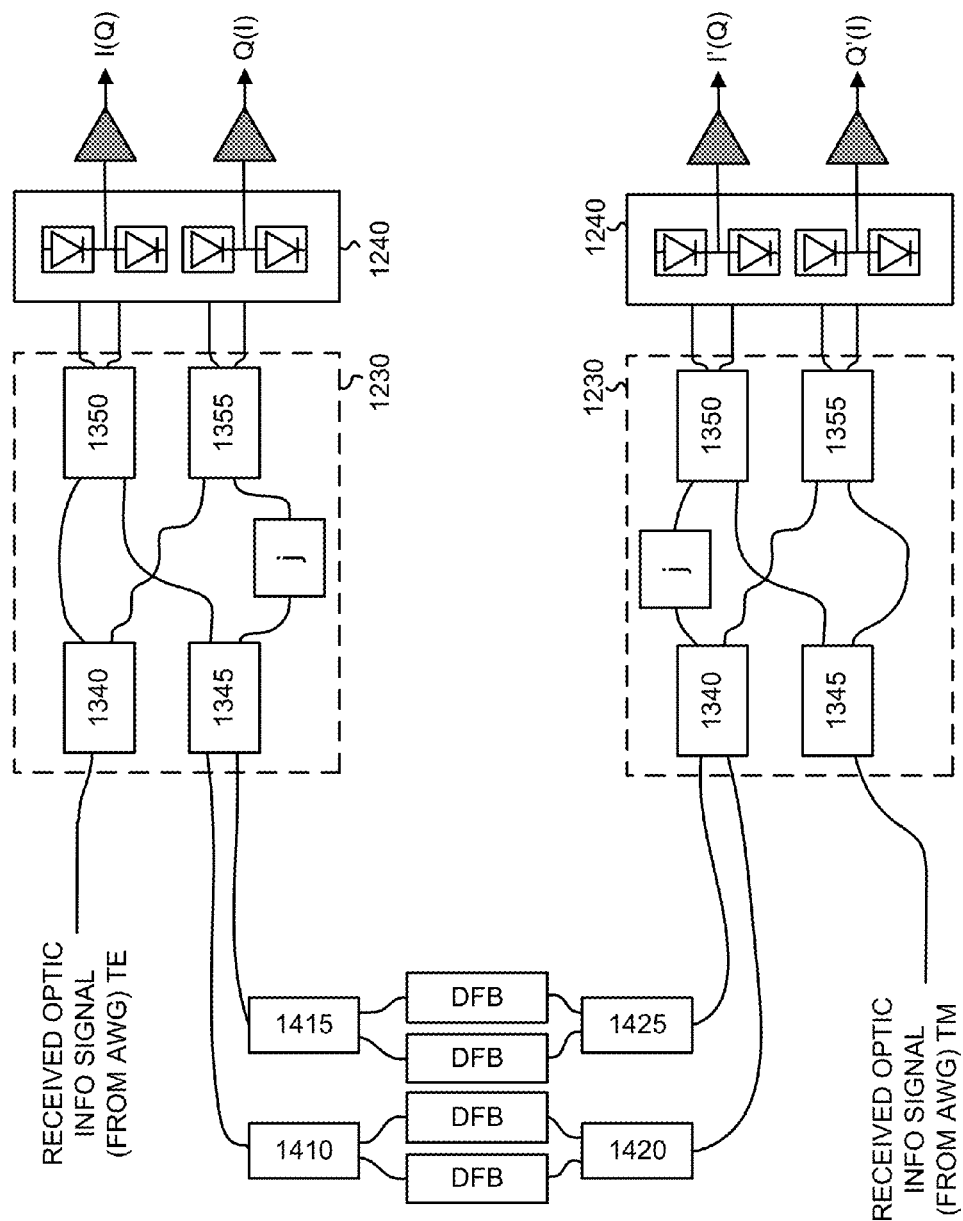
FIG. 14 is a diagram illustrating a second example of an implementation of an optical receiver.

FIG. 14 is a diagram illustrating second example implementation of an optical receiver 145. For clarity, tuning elements, such as tuning elements similar to tuning elements 335, 340, and 345 are not illustrated in FIG. 14, but may, in certain implementations, be included.

Optical receiver 145, as shown in FIG. 14, is similar to optical receiver 145, as shown in FIG. 13, except that four dual-output lasers 1410, 1415, 1420, and 1425 are illustrated instead of the four single-sided lasers (1310, 1315, 1320, and 1325). One output of each of dual-output lasers 1410, 1415, 1420, and 1425 may be input to the pair of optical couplers 1430 and 1440, while the other output of lasers 1410, 1415, 1420, and 1425 may be input to the pair of optical couplers 1450 and 1460. Optic couplers 1430/1440 may each provide an input to the upper optical hybrid 1230, shown in FIG. 14, and optical couplers 1450/1460 may each provide an input to the lower optical hybrid 1230, shown in FIG. 14. Optical hybrids 1230 and balanced detectors 1240 may otherwise function as described with respect to FIG. 13.

Although FIGS. 13 and 14 show example components of an optical receiver 145, in other implementations, optical receiver 145 may contain fewer components, different components, differently arranged components, and/or additional components than those depicted in FIGS. 13 and 14. Alternatively, or additionally, one or more components of optical receiver 145 may perform one or more other tasks described as being performed by one or more other components of optical receiver 145.

Figure 15:
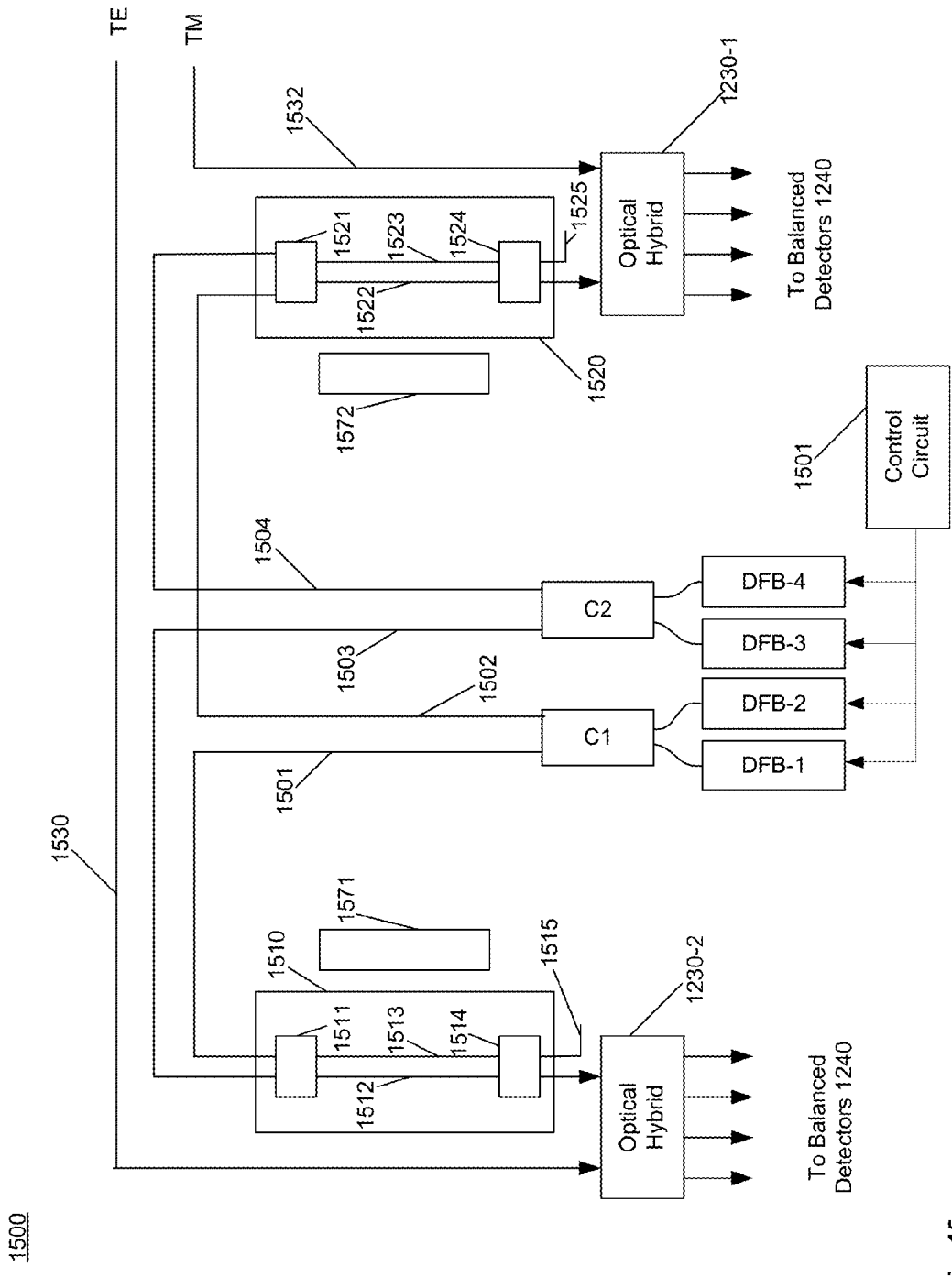
FIG. 15 is a diagram illustrating a third example of an implementation of an optical receiver.

For example, FIG. 15 shows an alternative optical receiver 1500 including four local oscillator lasers (DFB-1 to DFB-4), for example, each of which supplying light at a different wavelength. Control circuit 1501 is also provided that is coupled to each of lasers DFB-1 to DFB-4 to selectively turn on or activate each laser. Couplers C1 and C2 are configured to receive the outputs from laser pairs DFB-1/DFB-2 and DFB3/DFB-4, respectively. Coupler C1 has outputs or ports 1501 and 1502, which supply power split portions of the light output from the selected laser (e.g., DFB-1) to optical switches 1510 and 1520, respectively. Similarly, coupler C2 has outputs or ports 1503 and 1504, which supply power split portions of the light output from the selected laser (e.g., DFB-1) to optical switches 1510 and 1520, respectively.

Optical switch 1510 may include a Mach-Zehnder (MZ) interferometer having couplers 1511 and 1514 and waveguide arms 1512 and 1514 extending there between. A heater, such as thin film heater 1571 may be provided adjacent to optical switch 1510 to thereby adjust the temperature thereof. In response to changes in temperature of optical switch 1510 one of outputs 1501 and 1503 is optically coupled, in a known manner, to optical hybrid 1230-2 and the other output is optically coupled to "dump" port 1515, such that any light supplied by the deselected output (1501 or 1503) is not fed to optical hybrid 1230-2.

Optical switch 1520 may also include a MZ interferometer having couplers 1521 and 1524 and waveguide arms 1522 and 1523 extending there between. Heater 1572 may also be provided to adjust the temperature of optical switch 1520 so that one of outputs 1502 and 1504 is optically coupled to optical hybrid 1230-1 in a manner similar to that described above in regard to optical switch 1510.

In one example, demultiplexer 150 (FIG. 1) may include an AWG, and, in a further example, polarization multiplexed WDM optical signals are supplied from transmitter 115. These polarization multiplexed optical signals may be polarization demultiplexed to provide optical signals having a first (e.g., TE) and second (e.g., TM) polarizations. The optical signals having a given polarization may then be demultiplexed based on wavelength. Examples of WDM demultiplexing and polarization demultiplexing are described in U.S. patent application Ser. No. 12/572,179, filed on Oct. 1, 2009, the entire contents of which are incorporated herein by reference. Accordingly, demultiplexer 150 may supply pairs of optical signals at each wavelength, such that one optical signal in the pair has a TE polarization and the other has a TM polarization. In FIG. 15, the TE polarized optical signal is supplied to optical hybrid 1230-2 on input 1530 and the TM polarized optical signal is supplied to optical hybrid 1230-1 on input 1532.

In operation, one of local oscillator lasers DFB-1 to DFB-4 is activated, which, for purposes of the present discussion, the activated laser is DFB-1. Light from DFB-1 is power split by coupler C1, such that one portion of the light is provided to switch 1510 on output 1501 and the other is fed to switch 1520 on output 1502. Optical switches 1510 and 1520 are controlled by heaters 1571 and 1572, respectively, such that output 1501 is optically coupled to and supplies the first portion of the light to optical hybrid 1230-2 and output 1502 is optically coupled to and supplies the second portion of the light to optical hybrid 1230-1. The first portion of the light is mixed in a known manner with the TE optical signal in optical hybrid 1230-2 and the resulting outputs are fed to balanced detectors 1240 (see FIG. 12). Further, the second portion of the light is mixed with the TM optical signal in optical hybrid 1230-1 and the resulting outputs are supplied to other balanced detectors. The electrical signals generated by the balanced detectors in response to the received optical signals are subsequently processed, as discussed above.

The foregoing description provides illustration and description, but is not intended to be exhaustive or to limit the embodiments to the precise form disclosed. Modifications and variations are possible in light of the above teachings or may be acquired from practice of the embodiments.

Even though particular combinations of features are recited in the claims and/or disclosed in the specification, these combinations are not intended to limit the disclosure of the possible embodiments. In fact, many of these features may be combined in ways not specifically recited in the claims and/or disclosed in the specification.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. An apparatus, comprising:
  a first optical source configured to supply a first optical signal having a first wavelength;
  a second optical source configured to supply a second optical signal having a second wavelength;
  an arrayed waveguide grating including a plurality of input waveguides, a first dielectric slab, a second dielectric slab, a plurality of intermediate waveguides extending between the first dielectric slab and the second dielectric slab, and an output waveguide,
    one of the plurality of input waveguides being associated with a first passband and a second passband,
    the first passband being spectrally spaced from the second passband,
    the first passband including the first wavelength and the second passband including the second wavelength;
  a coupler having a first input and a second input, the first input of the coupler being coupled to the first optical source and the second input of the coupler being coupled to the second optical source, and an output coupled to said one of the plurality of input waveguides; and
  a control circuit configured to selectively supply power to one of the first optical source and the second optical source, such that said one of the first optical source and the second optical source is turned on and the remaining one of the first optical source and the second optical source is turned off, whereby one of the first optical signal and the second optical signal is selected and provided to the one of the plurality of input waveguides via the coupler, when the first optical signal is supplied to the one of the plurality of input waveguides, the first optical signal being output from the output waveguide, and when the second optical signal is supplied to the one of the plurality of input waveguides, the second optical signal being output from the output waveguide.

2. The apparatus in accordance with claim 1, where the first passband and the second passband, of the one of the plurality of input waveguides, are spectrally separated from each other by a free spectral range (FSR) associated with the arrayed waveguide grating.

3. The apparatus in accordance with claim 1, further including a tuning element configured to:

control the first optical source to selectively supply a third optical signal having a third wavelength to the one of the plurality of input waveguides, and control the second optical source to selectively supply a fourth optical signal having a fourth wavelength to the one of the plurality of input waveguides.

4. The apparatus in accordance with claim 3, where the tuning element is further configured to tune the arrayed waveguide grating to cause the one of the plurality of input waveguides to be associated with a third passband and a fourth passband, the third passband including the third wavelength and the fourth passband including the fourth wavelength, where, when the third optical signal is supplied to the one of the plurality of input waveguides, the third optical signal is output from the output waveguide, and where, when the fourth optical signal is supplied to the one of the plurality of input waveguides, the fourth optical signal is output from the output waveguide.

5. The apparatus in accordance with claim 4, where the third wavelength is greater than the first wavelength and less than the second wavelength, and where the fourth wavelength is greater than the second wavelength.

6. The apparatus in accordance with claim 4, where the first passband and the second passband are spectrally separated from each other by a first spectral distance substantially equal to a free spectral range (FSR) associated with the arrayed waveguide grating, and where the third passband and the fourth passband are spectrally separated from each other by a second spectral distance substantially equal to the FSR.

7. The apparatus in accordance with claim 6, where the FSR is substantially equal to 500 GHz.

8. The apparatus in accordance with claim 6, where the first wavelength is associated with a first frequency, the second wavelength is associated with a second frequency, the third wavelength is associated with a third frequency, and the fourth wavelength is associated with a fourth frequency, the first frequency and the third frequency being spectrally spaced from one another by 250 GHz, and the second frequency and the fourth frequency being separated from one another by 250 GHz.

9. The apparatus in accordance with claim 1, further including:

a substrate,
the arrayed waveguide grating, the first optical source, and the second optical source being provided on the substrate;
a first heater; and
a second heater, where the first heater and the second heater are configured to adjust a temperature of the first optical source to cause the first optical source to supply a third optical signal, having a third wavelength, to the one of the plurality of input waveguides.

10. The apparatus in accordance with claim 9, where the first heater and the second heater are configured to adjust a temperature of the second optical source to cause the second optical source to supply a fourth optical signal, having a fourth wavelength, to the one of the plurality of input waveguides.

11. The apparatus in accordance with claim 9, where the first heater includes a carrier on a chip (COC).

12. The apparatus in accordance with claim 9, where the first heater includes a thin film heater.

13. The apparatus in accordance with claim 9, where the substrate includes indium phosphide (InP).

14. The apparatus in accordance with claim 1, where the one of the plurality of input waveguides is a first one of the plurality of input waveguides, the apparatus further including a third optical source and a fourth optical source, the third optical source being configured to supply a third optical signal having a third wavelength, and the fourth optical source being configured to supply a fourth optical signal having a fourth wavelength, where the control circuit is configured to control the third optical source and the fourth optical source to selective supply one of the third optical signal or the fourth optical signal to a second one of the plurality of input waveguides.

15. An apparatus, comprising:

a first optical source configured to supply a first optical signal having a first wavelength;

a second optical source configured to supply a second optical signal having a second wavelength;

an arrayed waveguide grating including a plurality of input waveguides, a first dielectric slab, a second dielectric slab, a plurality of intermediate waveguides extending between the first dielectric slab and the second dielectric slab, and an output waveguide, one of the plurality of input waveguides being associated with a first passband and a second passband,
the first passband being spectrally spaced from the second passband based on a free spectral range (FSR) of the arrayed waveguide grating,
the first passband including the first wavelength and the second passband including the second wavelength;

a coupler having a first input and a second input, the first input of the coupler being coupled to the first optical source and the second input of the coupler being coupled to the second optical source, and an output coupled to said one of the plurality of input waveguides; and a control circuit configured to selectively supply power to one of the first optical source and the second optical source, such that said one of the first optical source and the second optical source is turned on and the remaining one of the first optical source and the second optical source is turned off, whereby one of the first optical signal and the second optical signal is selected and provided to the one of the plurality of input waveguides via the coupler, when the first optical signal is supplied to the one of the plurality of input waveguides, the first optical signal being output from the output waveguide, when the second optical signal is supplied to the one of the plurality of input waveguides, the second optical signal being output from the output waveguide.

16. The apparatus in accordance with claim 15, further including:
a substrate,
the arrayed waveguide grating, the first optical source, and the second optical source being provided on the substrate;
a first heater; and
a second heater,
where the first heater and the second heater are configured to adjust a temperature of the first optical source.

17. The apparatus in accordance with claim 16, where the first heater includes a carrier on a chip (COC).

18. The apparatus in accordance with claim 16, where the first heater includes a thin film heater.

19. The apparatus in accordance with claim 16, where the substrate includes indium phosphide (InP).

20. The apparatus in accordance with claim 15, where the first passband and the second passband are separated by a frequency that is based on the free spectral range and a quantity of pairs of optical sources of the arrayed waveguide grating.

21. The apparatus in accordance with claim 15, where the free spectral range is substantially equal to 500 GHz.

22. The apparatus in accordance with claim 15, where the first wavelength is associated with a first frequency and the second wavelength is associated with a second frequency.

23. The apparatus in accordance with claim 15, where the one of the plurality of input waveguides is a first one of the plurality of input waveguides,
the apparatus further including a third optical source and a fourth optical source,
the third optical source being configured to supply a third optical signal having a third wavelength,
the fourth optical source being configured to supply a fourth optical signal having a fourth wavelength,
where the control circuit is configured to control the third optical source and the fourth optical source to selectively supply one of the third optical signal or the fourth optical signal to a second one of the plurality of input waveguides.

24. The apparatus in accordance with claim 15, where the first optical source and the second optical source include a first laser and a second laser, respectively, that output signals to a first Mach-Zehnder modulator and a second Mach-Zehnder modulator, respectively.

25. An apparatus, comprising:
a first optical source configured to supply first light having a first wavelength;
a second optical source configured to supply second light having a second wavelength;
a third optical source configured to supply third light having a third wavelength;
a fourth optical source configured to supply fourth light having a fourth wavelength;
an arrayed waveguide grating including a plurality of input waveguides, a plurality of intermediate waveguides, and an output waveguide,
one of the plurality of input waveguides being associated with a first passband, a second passband, a third passband, and a fourth passband,
the first passband including the first wavelength, the second passband including the second wavelength, the third passband including the third wavelength, and the fourth passband including the fourth wavelength;
a coupler having an output, a first input, and a second input, one of the first and second inputs of the coupler receiving one the first light, the second light, the third light, and the fourth light, the output being coupled to the one of the plurality of input waveguides; and
a control circuit configured to selectively supply power to one of the first optical source, the second optical source, the third optical source, and the fourth optical source such that said one of the first optical source, the second optical source, and the third optical source is turned on and the remaining ones of the first, second, third, and fourth sources are turned off, whereby one of the first light, the second light, the third light, and the fourth light is selected and provided to the one of the first and second inputs of the coupler, such that said selected one of the first, second, third, and fourth lights is supplied to the one of the plurality of input waveguides via the coupler.

26. An apparatus in accordance with claim 25, where the first passband is spectrally spaced from the second passband by a free spectral range (FSR) of the arrayed waveguide grating,
where the second passband is spectrally spaced from the third passband by the FSR, and
where the third passband is spectrally spaced from the fourth passband by the FSR.

* * * * *